(12) United States Patent
Kim et al.

(10) Patent No.: US 11,309,380 B2
(45) Date of Patent: Apr. 19, 2022

(54) DISPLAY DEVICE

(71) Applicant: Samsung Display Co., LTD., Yongin-si (KR)

(72) Inventors: Ki Wook Kim, Hwaseong-si (KR); Joong-Soo Moon, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/880,459

(22) Filed: May 21, 2020

(65) Prior Publication Data

US 2021/0091162 A1 Mar. 25, 2021

(30) Foreign Application Priority Data

Sep. 25, 2019 (KR) .................. 10-2019-0118133

(51) Int. Cl.
*H01L 27/32* (2006.01)
*H05K 1/18* (2006.01)

(52) U.S. Cl.
CPC ........ *H01L 27/3276* (2013.01); *H01L 27/326* (2013.01); *H05K 1/189* (2013.01); *H05K 2201/10128* (2013.01)

(58) Field of Classification Search
CPC .... H01L 27/3276; H01L 27/326; H05K 1/189
See application file for complete search history.

(56) References Cited

U.S. PATENT DOCUMENTS

| | | | |
|---|---|---|---|
| 2007/0120789 A1 | 5/2007 | Lee et al. | |
| 2016/0313392 A1* | 10/2016 | Dong | G01R 31/2884 |
| 2018/0286939 A1* | 10/2018 | Lee | H01L 24/32 |
| 2019/0088584 A1 | 3/2019 | Won et al. | |
| 2019/0122943 A1* | 4/2019 | Lim | H05K 1/0268 |
| 2019/0163304 A1* | 5/2019 | Shim | G06F 3/0412 |
| 2020/0027824 A1* | 1/2020 | Min | H05K 1/0268 |

FOREIGN PATENT DOCUMENTS

| | | |
|---|---|---|
| EP | 3457822 | 3/2019 |
| KR | 10-2017-0076189 | 7/2017 |
| KR | 10-1882700 | 7/2018 |
| KR | 10-1934439 | 3/2019 |
| KR | 10-1971066 | 4/2019 |
| KR | 10-2019-0046420 | 5/2019 |

* cited by examiner

*Primary Examiner* — Douglas M Menz
(74) *Attorney, Agent, or Firm* — Kile Park Reed & Houtteman PLLC

(57) ABSTRACT

A display panel includes pixels and a driver IC pad area; a driver IC on the driver IC pad area of the display panel; first input pads and first output pads that overlap the driver IC pad area; a flexible printed circuit adjacent to the driver IC pad area on the display panel; first output test pads that overlap the flexible printed circuit, and are respectively extended to the first output pads; and first input extending wires that overlap the flexible printed circuit, are respectively extended to the first input pads, and are between the first output test pads.

22 Claims, 25 Drawing Sheets

DISPLAY DEVICE

CROSS-REFERENCE TO RELATED APPLICATIONS

This application claims priority to and benefits of Korean Patent Application No. 10-2019-0118133 under 35 U.S.C. § 119, filed in the Korean Intellectual Property Office on Sep. 25, 2019, the entire contents of which are incorporated herein by reference.

BACKGROUND

1. Technical Field

The disclosure relates to a display device.

2. Description of the Related Art

Display devices may include a liquid crystal display (LCD) and an organic light emitting diode (OLED) display. Such display devices are used in various electronic devices such as portable phones, navigation systems, digital cameras, electronic books, portable game consoles, and various terminals.

Such display devices may include a display panel including pixels, and a driver for supplying signals to the pixels. Gate lines and data lines may be formed on the display panel, and each pixel may be connected with a gate line and a data line to receive a predetermined signal. The driver may include a gate driver and a data driver. The gate line may receive a gate signal from the gate driver, and the data line may receive a data signal from the data driver.

Such a driver may be in the form of a driver IC (Integrated Circuit) chip. The driver IC chip may be attached to one edge of the display panel in a chip-on-glass (COG) method. When bonding between the display panel and the driver IC chip is not properly performed, bonding resistance may increase and adversely affect the driving of the display device. Therefore, the bonding resistance of the driver IC chip after the bonding process may be measured to test whether the display device is properly driven. In this case, there may be a problem that the area of the driver of the display panel may be widened by adding a pad for measuring the bonding resistance to the display panel to measure the bonding resistance.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments are herein described in an effort to solve the above-stated problems by providing a display device that may reduce the area of a driver of a display panel. However, the embodiments are not limited to the solution of only the above-stated problems and may apply to the solutions of other problems as may be appreciated by those of ordinary skill in the art.

A display device according to an embodiment may include: a display panel including pixels and a driver IC pad area; a driver IC disposed on the driver IC pad area of the display panel; first input pads and first output pads that overlap the driver IC pad area; a flexible printed circuit disposed adjacent to the driver IC pad area on the display panel; first output test pads that overlap the flexible printed circuit, and are respectively extended to the first output pads; and first input extending wires that overlap the flexible printed circuit, are respectively extended to the first input pads, and are disposed between the first output test pads.

The display device according to an embodiment may further include second input pads and second output pads that overlap the driver IC pad area, wherein the first input pads and the second input pads may be symmetric with respect to an imaginary line disposed between the first input pad and the second input pad, and the first output pad and the second output pad may be symmetric with respect to an imaginary line disposed between the first output pads and the second output pads.

The first input pads and the second input pads may be linearly arranged adjacent to the flexible printed circuit, and the first output pads and the second output pads may be linearly arranged at a distance from the first input pads and the second input pads.

The display device may include: second output test pads that overlap the flexible printed circuit, and are respectively extended to the second output pads; and second input extending wires that overlap the flexible printed circuit, and are extended to the second input pads and disposed between the second output test pads.

The display device according to an embodiment may further include: first output extending wires that are respectively extended to the first output pads and the first output test pads; and second output extending wires that are respectively extended to the second output pads and the second output test pads.

The display device according to an embodiment may include: second input test pads that overlap the flexible printed circuit, and are respectively extended to the second input pads; and second output extending wires that overlap the flexible printed circuit, and are respectively extended to the second output pads and are disposed between the second input test pads.

The display device according to an embodiment may further include: first output extending wires that are respectively extended to the first output pads and the first output test pads; and second input extending wires that are respectively extended to the second input pads and the second input test pads.

A constant voltage may be applied to the first output test pads.

A display device according to an embodiment may include: a display panel including pixels; a driver IC pad area disposed on the display panel; first input pads and first output pads that overlap the driver IC pad area; a flexible printed circuit disposed adjacent to the driver IC pad area on the display panel; first input test pads that overlap the flexible printed circuit, and are respectively extended to the first input pads; and first output extending wires that overlap the flexible printed circuit, and are respectively extended to the first output pads and are disposed between the first input test pads.

The display device according to an embodiment may further include second input pads and second output pads that overlap the driver IC pad area, wherein the first input pads and the second input pads may be symmetric with respect to an imaginary line disposed between the first input pads and the second input pads, and the first output pads and the second output pads are symmetric with respect to an imaginary line disposed between the first output pads and the second output pads.

The first input pads and the second input pads may be linearly disposed adjacent to the flexible printed circuit, and the first output pads and the second output pads may be linearly arranged at a distance from the first input pads and the second input pads.

The display device according to an embodiment may include: second input test pads that overlap the flexible printed circuit, and are respectively extended to the second input pads; and second output extending wires that overlap the flexible printed circuit, and are respectively extended to the second output pads and disposed between the second input test pads.

The display device according to an embodiment may further include: first input extending wires that are respectively extended to the first input pads and the first input test pads; and second input extending wires that are respectively extended to the second input pads and the second input test pads.

The display device according to an embodiment may include: second output test pads that overlap the flexible printed circuit, and are respectively extended to the second output pads; and second input extending wires that overlap the flexible printed circuit, and are respectively extended to the second input pads and are disposed between the second output test pads.

The display device according to an embodiment may further include: a first input extending wires that are respectively extended to the first input pads and the first input test pads; and second output extending wires that are respectively extended to the second output pads and the second output test pads.

A constant voltage may be applied to the first input test pads.

A display device according to an embodiment may include: a display panel including pixels; first pads disposed on the display panel; second pads disposed apart from the first pads on the display panel; first test pads respectively extending to the first pads; second test pads respectively extending to the second pads; first extending wires that extending to the first pads and the first test pads; and second extending wires that extending to the second pads and the second test pads, wherein the second test pads are disposed at an edge of the display panel, and the second extending wires are disposed between the first test pads.

The first test pads may be linearly arranged along a first direction, and the second test pads may be linearly arranged along the first direction at a distance from the first test pads.

In an embodiment, the display panel may include a cutting line between the first test pads and the second test pads.

The first test pads may be symmetric with respect to an imaginary line that extends in a second direction perpendicular to the first direction, and the second test pads are symmetrical with respect to the imaginary line.

The first pads may be linearly arranged along the first direction, and the second pads may be linearly arranged along the first direction at a distance from the first pads.

The first pads may be symmetric with respect to an imaginary line that extends in a second direction perpendicular to the first direction, and the second pads may be symmetric with respect to the imaginary line.

According to embodiments, the area of the driving unit of the display panel may be reduced by placing at least a portion of the bonding resistance measuring pad in a portion removed through a cutting or separation or removal process after measuring the bonding resistance.

DETAILED DESCRIPTION OF THE EMBODIMENTS

Figure 1:
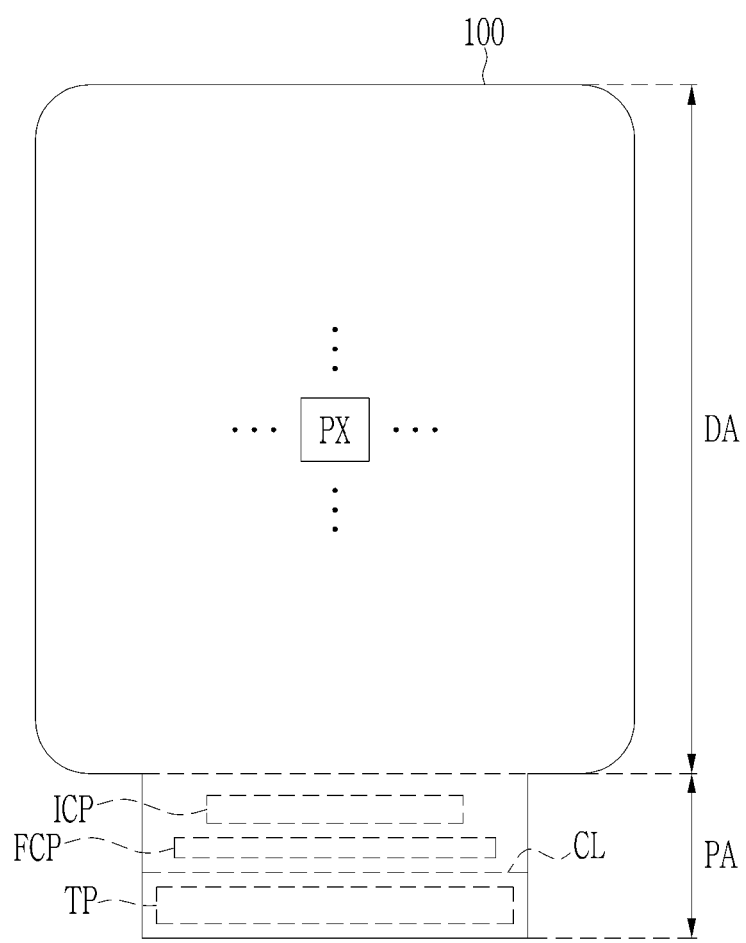
FIG. 1 is a top plan view of a display device according to an embodiment.

Although the disclosure may be modified in various manners and have additional embodiments, embodiments are illustrated in the accompanying drawings and will be mainly described in the specification. However, the scope of the disclosure is not limited to the embodiments in the accompanying drawings and the specification and should be construed as including all of the changes, equivalents, and substitutions included in the spirit and scope of the disclosure.

Some of the parts which are not associated with the description may not be provided in order to describe embodiments of the disclosure and like reference numerals refer to like elements throughout the specification.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side. In addition, in this specification, the phrase "on a plane" means viewing a target portion from the top.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

It will be understood that when an element such as a layer, film, region, substrate, or area is referred to as being "on" another element, it may be directly on the other element or intervening elements may also be present. In contrast, when an element is referred to as being "directly on" another element, intervening elements may be absent therebetween.

Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

Although the terms "first," "second," and the like are used for describing various components, these components are not confined by these terms. These terms are merely used for distinguishing one component from the other components. Therefore, a first component may be a second component or vice versa according within the spirit and scope of the disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

A display device according to an embodiment will be described with reference to FIG. 1 to FIG. 12.

Figure 4:
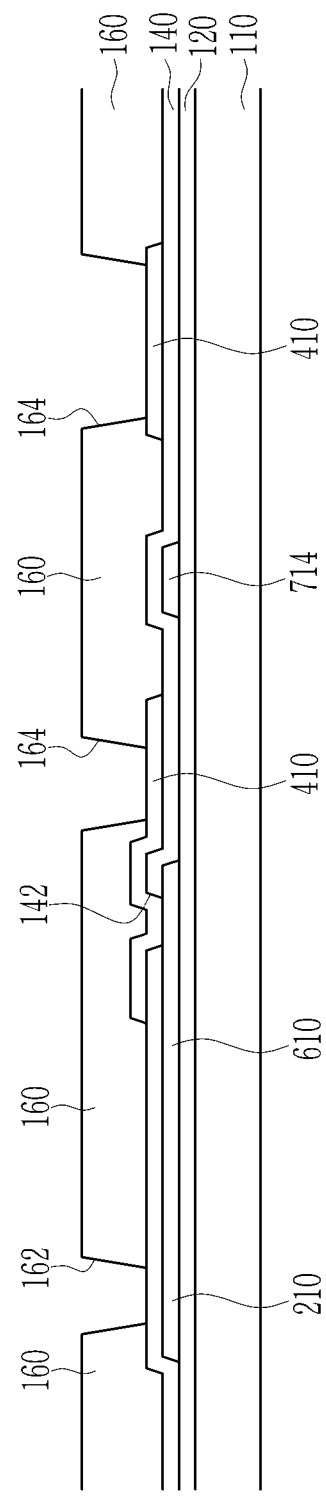
FIG. 4 is a schematic cross-sectional view of FIG. 3, taken along the line IV-IV
Figure 5:
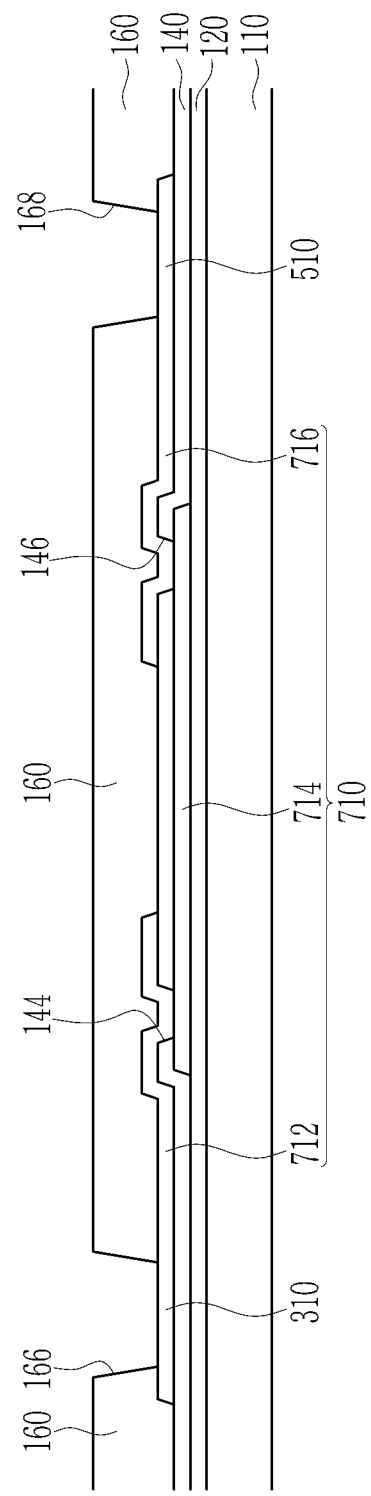
FIG. 5 is a schematic cross-sectional view of FIG. 3, taken along the line V-V.
Figure 6:
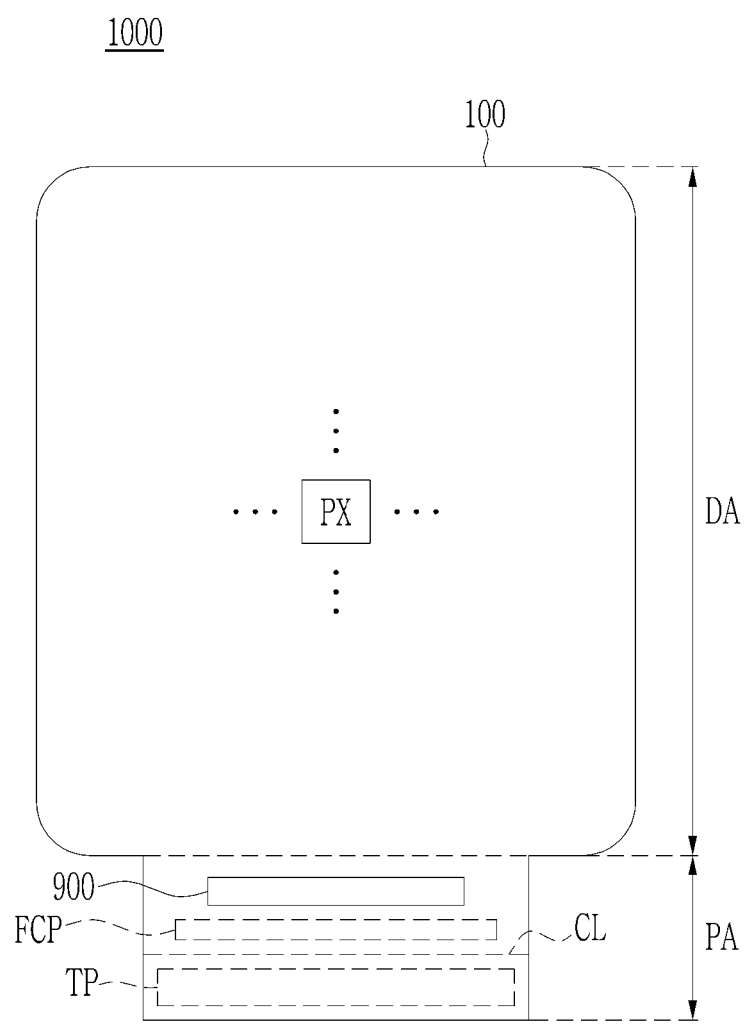
FIG. 6 is a top plan view of the display device according to an embodiment.
Figure 7:
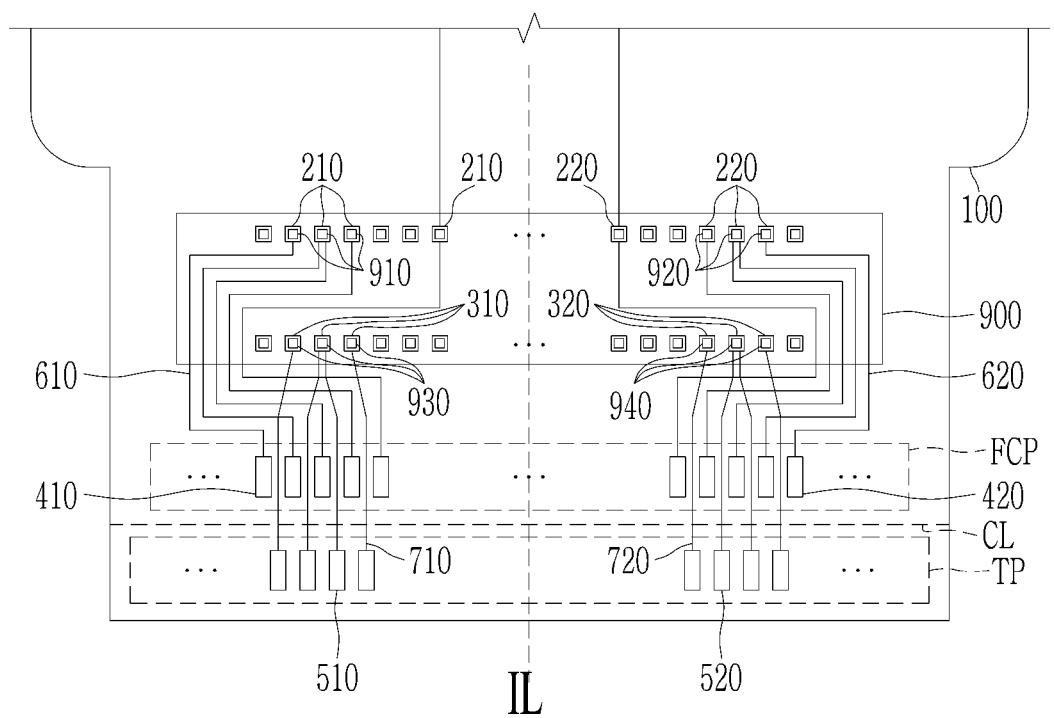
FIG. 7 is a block diagram of an area of the display device according to an embodiment.
Figure 8:
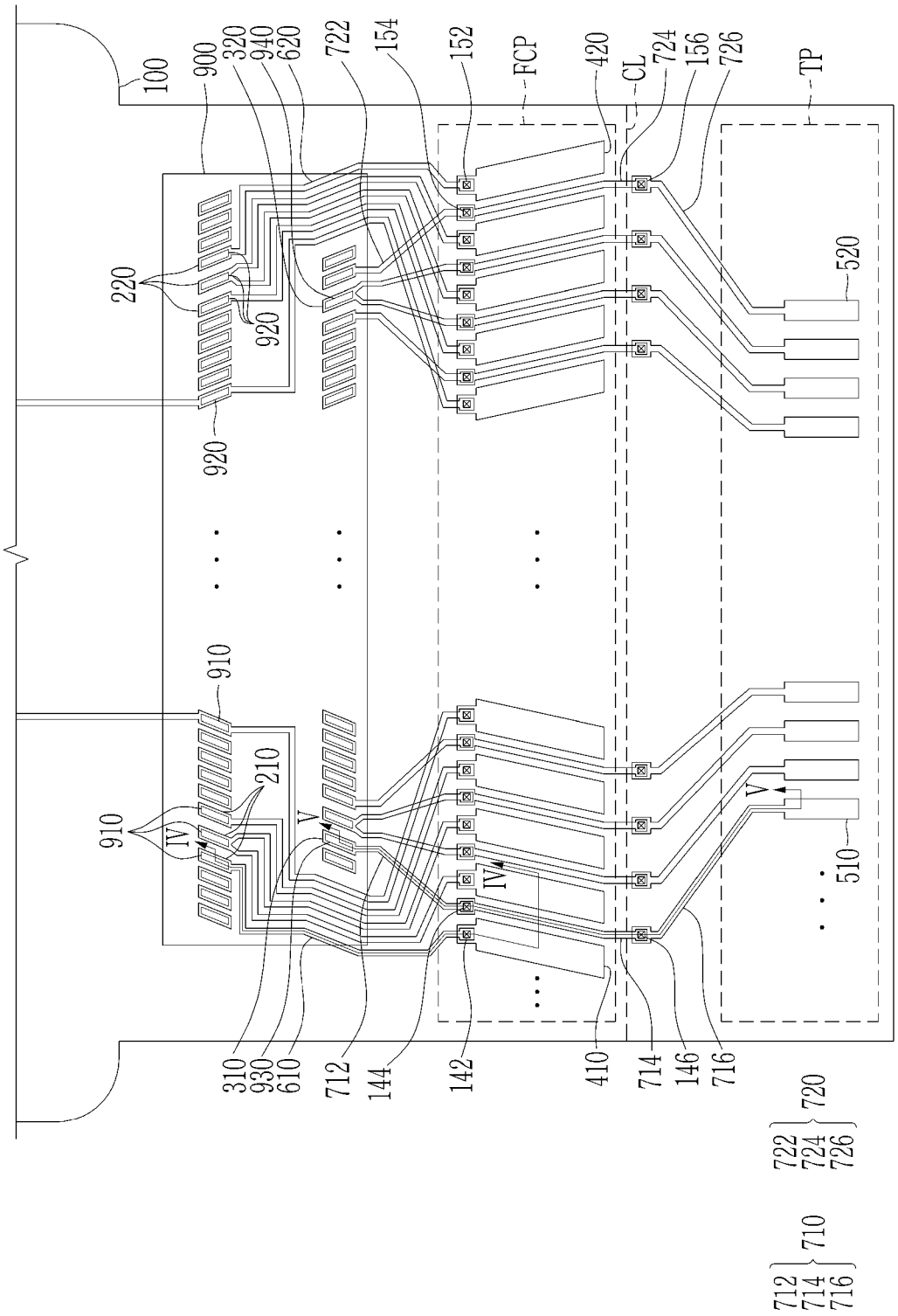
FIG. 8 is a top plan view of the area shown in FIG. 7.
Figure 9:
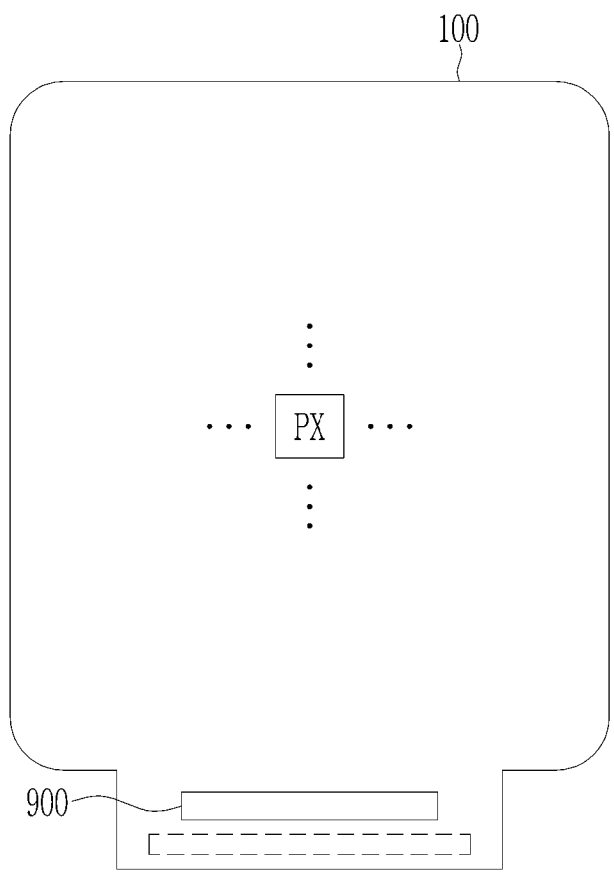
FIG. 9 is a top plan view of the display device according to an embodiment.
Figure 10:
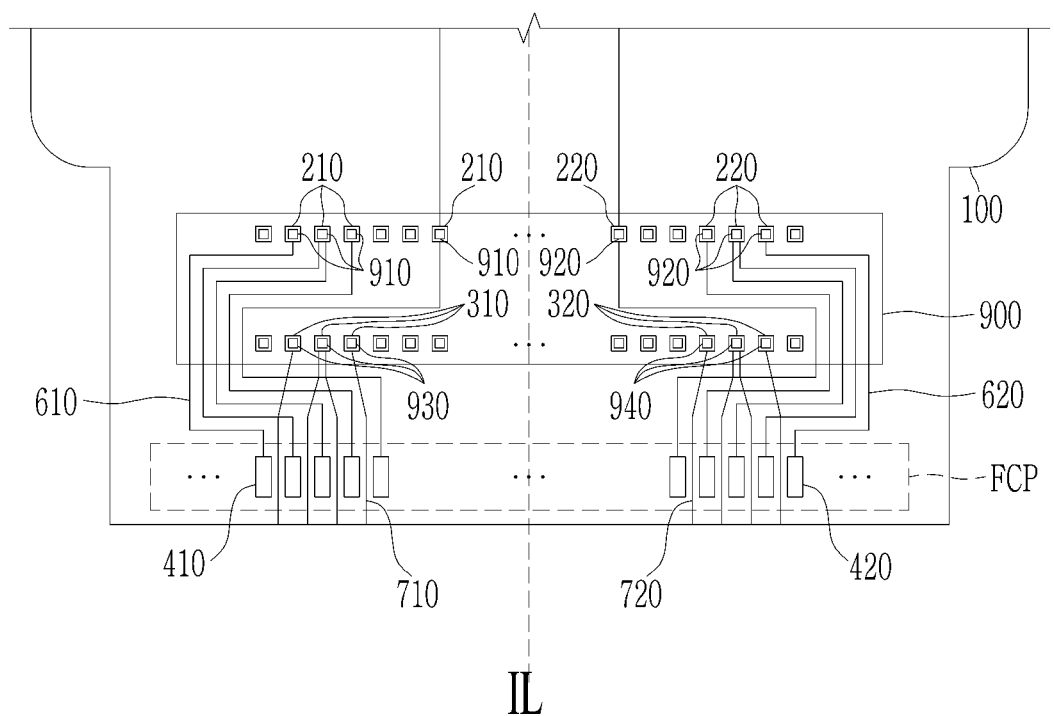
FIG. 10 is a block diagram of an area of the display device according to an embodiment.
Figure 11:
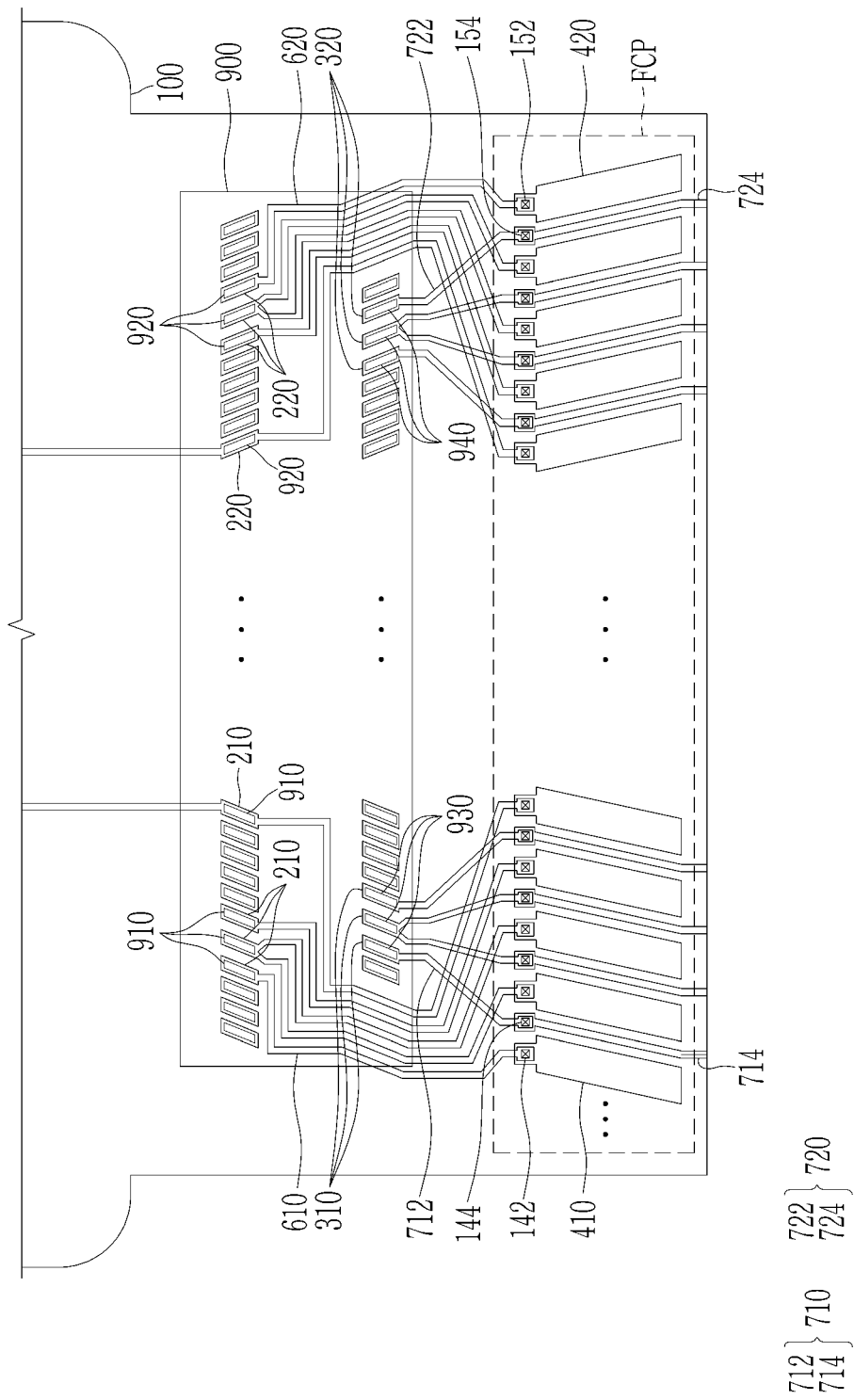
FIG. 11 is a top plan view of the area shown in FIG. 10.

FIG. 1 to FIG. 5 illustrate a state before bonding a driving integrated circuit to a display device according to an embodiment. FIG. 6 to FIG. 8 illustrate a state after bonding the driving integrated circuit to the display device according to an embodiment. FIG. 9 to FIG. 11 illustrate a state after processing a cutting process of the display device according to an embodiment. FIG. 12 to FIG. 15 illustrate a state after attaching a flexible printed circuit to the display device according to an embodiment.

Hereinafter, referring to FIG. 1 to FIG. 5, a state before bonding a driving integrated circuit to a display device according to an embodiment will be described.

Figure 2:
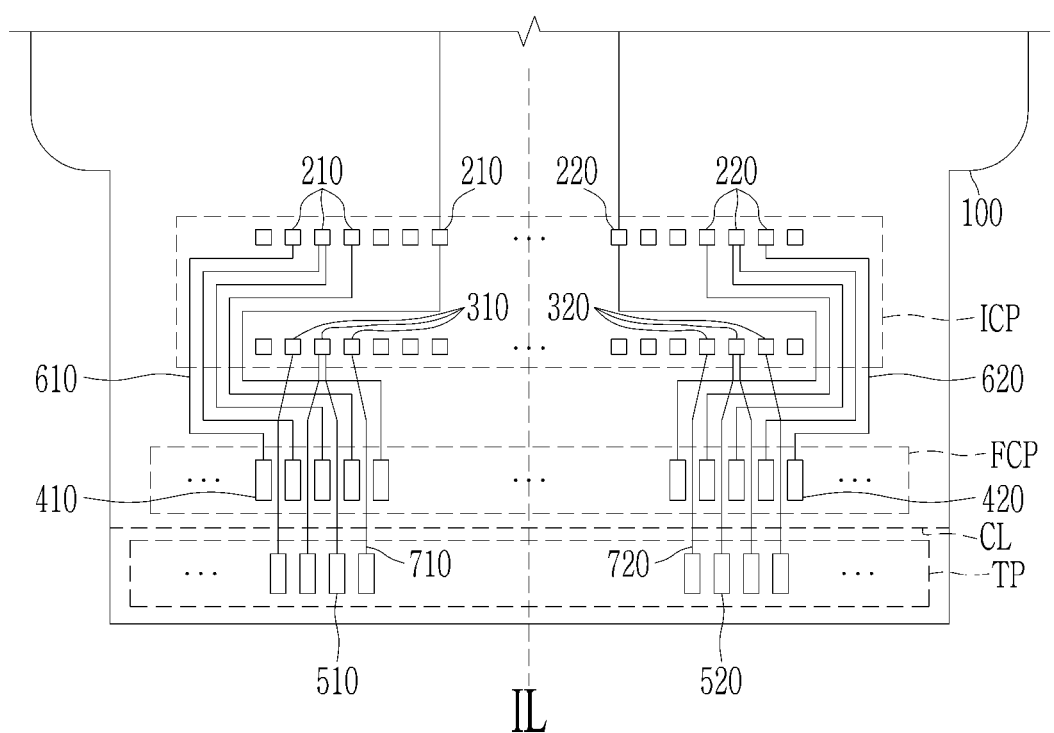
FIG. 2 is a block diagram of a region of the display device according to an embodiment.
Figure 3:
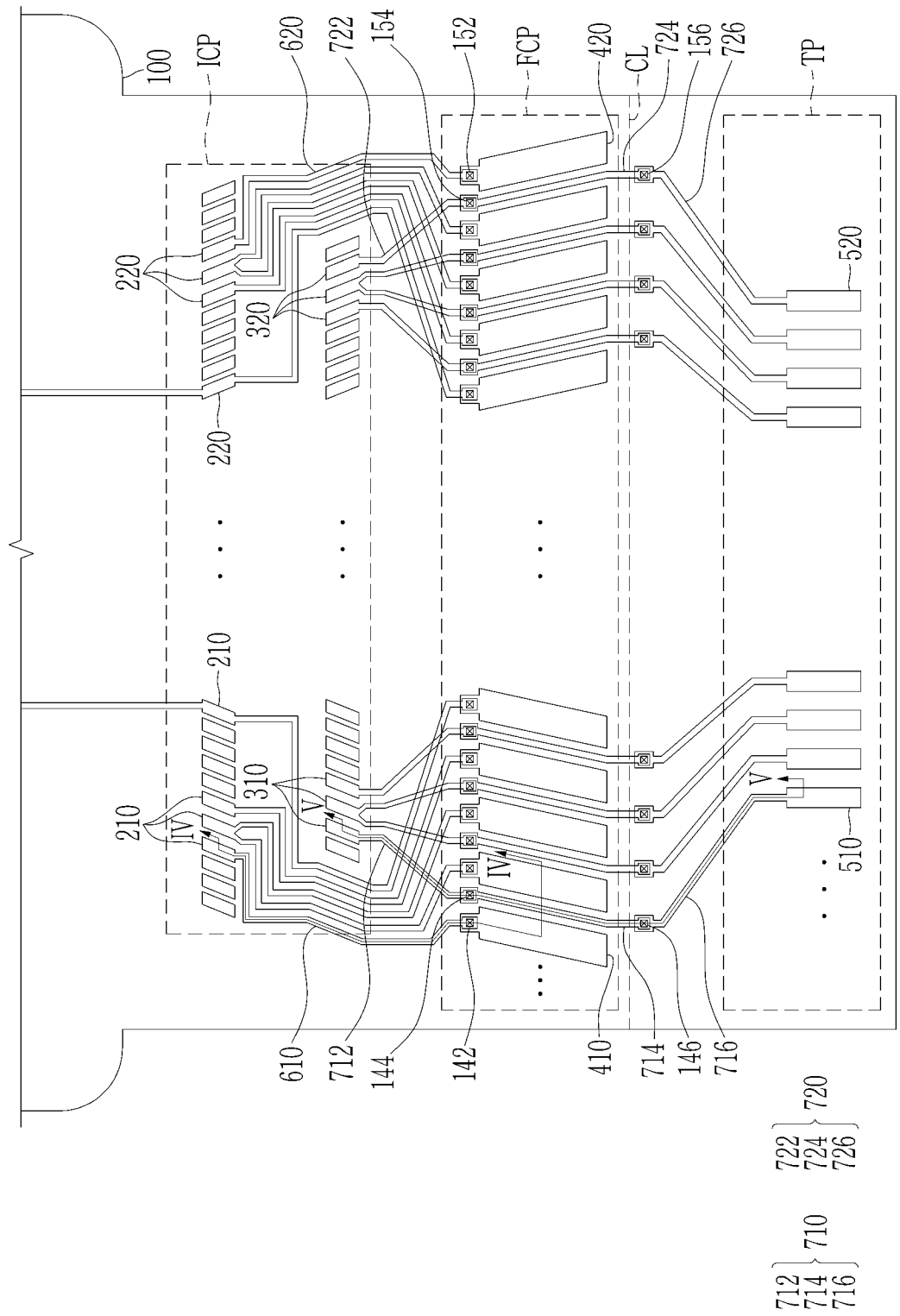
FIG. 3 is a top plan view of the region of FIG. 2.

FIG. 1 is a top plan view of a display device according to an embodiment, FIG. 2 is a block diagram of a region of the display device according to an embodiment, and FIG. 3 is a top plan view of the region of FIG. 2. FIG. 4 is a schematic cross-sectional view of FIG. 3, taken along the line IV-IV, and FIG. 5 is a schematic cross-sectional view of FIG. 3, taken along the line V-V.

As shown in FIG. 1, a display device 1000 according to an embodiment may include a display panel 100 that may display an image or images and may include pixels PX.

The display panel 100 may include a display area DA where a screen is displayed, and a peripheral area PA where a driving circuit for driving the display area DA may be mounted. The display panel 100 may be formed of a flexible material and thus may be changed into various shapes. The display panel 100 may be flexible, stretchable, foldable, bendable, or rollable. The display panel 100 may be bent at a boundary between the display area DA and the peripheral area PA. The peripheral area PA may be bent from the display area DA and thus may be located or disposed at a rear side of the display area DA. However, this is merely an example, and the position of the peripheral area PA may be variously changed.

The display area DA of the display panel 100 may be formed in the shape of a rectangle including a long side and a short side, and may have a shape having a curved surface by chamfering corner portions. However, such a shape of the display area DA is just an example, and may be changed into various shapes. Pixels PX may be located or disposed in most of the display area DA to enable the display of an image or images. An area where no pixel PX may be located or disposed, for example in an edge area or portion of the display area DA, may correspond to an area where a screen is not located or disposed.

The pixels PX may be located or disposed in a matrix format, and receive an image signal and a screen may display an image or images. The arrangement of the pixels PX may be variously changed. Although it is not illustrated, the display panel 100 may include signal lines. The signal lines may include scan lines, control lines, data lines, driving voltage lines, and the like. Signal lines may transmit a scan signal, a control signal, a data signal, a driving voltage, or the like. The signal lines may be located or disposed to cross each other in a row direction or a column direction. Each pixel PX may include transistors connected to the signal lines, a capacitor, and at least one light emitting diode. For example, the display panel 100 may be formed as an organic light emitting display panel. However, the type of the display panel 100 is not restrictive, and may be any of various types of panels. For example, the display panel 100 may be a liquid crystal display panel, an electrophoretic display panel, an electro-wetting display panel, or the like. The display panel 100 may be the next generation display panel such as a micro light emitting diode (microLED) display panel, a quantum dot light emitting diode (QLED) display panel, and a quantum dot organic light emitting diode (QD-OLED) display panel.

A light emitting diode with a size in a range of about 10 to about 100 micrometers may form each pixel such that the micro light emitting diode display panel may be formed. The micro light emitting diode display panel may use inorganic materials, color filters and backlights may be omitted, the reaction speed is fast, high luminance may be realized with low power, and it may not break when bent. The quantum dot light emitting diode (QLED) display panel may be formed by attaching a film containing quantum dots or depositing a material containing quantum dots. A quantum dot may be composed of inorganic materials such as indium, cadmium, and the like, and may refer to a particle that emits light by itself and has a diameter of several nanometers or less. By controlling the particle size of the quantum dots, light of a desired color may be displayed. The quantum dot organic light emitting diode (QD-OLED) display panel may use a blue organic light emitting diode as the light source, and may implement a color by attaching a film containing red and green quantum dots or stacking a material containing quantum dots. The display panel 100 according to an embodiment may include various types of display panels.

The peripheral area PA of the display panel 100 may include a cutting line CL. It is to be understood that the cutting line is not limited to that of cutting, but instead may include other separation or removal processes within the spirit and the scope of the disclosure. A part of the peripheral area PA of the display panel 100 may be removed in a later cutting process. A portion of the peripheral area PA located or disposed inside or near or adjacent to the cutting line CL may remain as a reference, and a portion located or disposed outside the cutting line CL may be removed. The peripheral area PA of the display panel 100 may include a driver IC pad area ICP and a flexible printed circuit pad area FCP. The driver IC pad area ICP and the flexible printed circuit pad area FCP may be located or disposed in a portion that remains even after the cutting process. For example, the driver IC pad area ICP and the flexible printed circuit pad area FCP may be located or disposed inside or near or adjacent to the cutting line CL. For example, the driver IC pad area ICP may be located or disposed closer to the display area DA of the display panel 100 than the flexible printed circuit pad area FCP. The peripheral area PA of the display panel 100 may include a test pad area TP. The test pad area TP may be removed by the cutting process. The test pad area TP may be located or disposed outside the cutting line CL. The cutting line CL may be located or disposed between the flexible printed circuit pad area FCP and the test pad area TP. The flexible printed circuit pad area FCP may be located or disposed between the driver IC pad area ICP and the test pad area TP.

As shown in FIG. 2, first input pads 310 and first output pads 210 may be located or disposed in the driver IC pad area ICP of the display panel 100. Second input pads 320 and second output pads 220 may be located or disposed in the driver IC pad area ICP of the display panel 100. In the driver IC pad area ICP, the first input pads 310 and the second input pads 320 may be symmetrical (or substantially symmetrical) to each other with respect to an imaginary line IL that is located or disposed between the first input pads 310 and the second input pads 320. Similarly, in the driver IC pad area ICP, the first output pads 210 and the second output pads 220 may be symmetrical (or substantially symmetrical) to each other with respect to an imaginary line IL that is located or disposed between the first output pads 210 and the second output pads 220. The imaginary line IL may substantially extend in a vertical direction, and may be located or disposed at a center of the driver IC pad area ICP. Thus, the first input pads 310 and the first output pads 210 may be located or disposed at the left side of the imaginary line IL, and the second input pads 320 and the second output pads 220 may be located or disposed at the right side of the imaginary line IL. However, the embodiment is not limited thereto. The driver IC pad area ICP may be horizontally symmetric (or substantially symmetric in horizontal). However, this is just an example, and an area where at least a part of the driver IC pad area ICP is not symmetrical may exist.

The first input pads 310 and the second input pads 320 may be located or disposed at an edge of the driver IC pad area ICP. For example, the first input pads 310 and the second input pads 320 may be located or disposed at an edge that may be adjacent to the flexible printed circuit pad area FCP. The first input pads 310 and the second input pads 320 may be linearly (or substantially linearly) arranged. The first input pads 310 and the second input pads 320 may extend in a direction that may be perpendicular to the imaginary line IL, for example, approximately in a horizontal direction. The first output pads 210 and the second output pads 220 may be located or disposed at an other edge of the driver IC pad area ICP. For example, the first output pads 210 and the second output pads 220 may be located or disposed at an edge that faces the edge where the first input pads 310 and the second input pads 320 may be located or disposed. The first output pads 210 and the second output pads 220 may be linearly (or substantially linearly) arranged at a predetermined distance from the f first input pads 310 and the second input pads 320. The first output pads 210 and the second output pads 220 may extend in a direction perpendicular to the imaginary line IL, for example, approximately in a horizontal direction.

At least one of the first output pads 210 may be connected to the display area DA through a wire. For example, at least one of the first output pads 210 may be connected with a pixel PX of the display area DA through a wire. Similarly, at least one of the second output pads 220 may be connected to the display area DA through a wire.

First output test pads 410 may be located or disposed in the flexible printed circuit pad area FCP of the display panel 100. The first output test pads 410 may be respectively extended to the first output pads 210. The first output pads 210 and the first output test pads 410 may be respectively extended to each other by first output extending wires 610. Second output test pads 420 may be located or disposed in the flexible printed circuit pad area FCP of the display panel 100. The second output test pads 420 may be respectively extended to the second output pads 220. The second output pads 220 and the second output test pads 420 may be respectively extended to each other by second output extending wires 620. The first output test pads 410 and the second output test pads 420 may be symmetrical (or substantially symmetrical) to each other with reference to an imaginary line IL that may be located or disposed between the first output test pads 410 and the second output test pads 420 in the flexible printed circuit pad area FCP. The imaginary line IL may extend approximately in a vertical direction, and may be located or disposed at a center of the flexible printed circuit pad area FCP. Thus, the first output test pads 410 may be located or disposed at the left side of the imaginary line IL, and the second output test pads 420 may be located or disposed at the right side of the imaginary line IL. However, the disclosure is not limited thereto. The flexible printed circuit pad area FCP may be horizontally symmetric (or substantially symmetric in horizontal). However, this is just an example, and an area where at least a part of the flexible printed circuit pad area FCP is not symmetrical may exist.

The first output test pads 410 and the second output test pads 420 may be linearly (or substantially linearly) arranged. The first output test pads 410 and the second output test pads 420 may extend in a direction that may be perpendicular to the imaginary line IL, for example, approximately in a horizontal direction. The first output test pads 410 and the second output test pads 420 may be located or disposed to be adjacent to the first input pads 310 and the second input pads 320. The first input pads 310 may be located or disposed between the f first output pads 210 and the first output test pads 410. As an example, the second input pads 320 may be located or disposed between the second output pads 220 and the second output test pads 420.

First input test pads 510 may be located or disposed in the test pad area TP of the display panel 100. The first input test pads 510 may be respectively extended to the first input pads 310. The first input pads 310 and the first input test pads 510 may be respectively extended by first input extending wires 710. Second input test pads 520 may be located or disposed in the test pad area TP of the display panel 100. The second input test pads 520 may be respectively extended to the second input pads 320. The second input pads 320 and the second input test pads 520 may be respectively extended by second input extending wires 720. In the test pad area TP, the first input test pads 510 and the second input test pads 520 may be symmetrical (or substantially symmetrical) to each other with respect to an imaginary line IL located or disposed between the first input test pads 510 and the second input test pads 520. The imaginary line IL may substantially extend in a perpendicular direction, and may be located or disposed at a center of the test pad area TP. Thus, the first input test pads 510 may be located or disposed at the left side of the imaginary line IL, and the second input test pads 520 may be located or disposed at the right side of the imaginary line IL. However, the disclosure is not limited thereto. The test pad area TP may be horizontally symmetric (or substantially symmetric in horizontal). However, this is just an example, and an area where at least a part of the test pad area TP is not symmetrical may exist.

The first input test pads 510 and the second input test pads 520 may be linearly (or substantially linearly) arranged. The first input test pads 510 and the second input test pads 520 may extend in a direction that may be perpendicular to the imaginary line IL, for example, approximately in a horizontal direction. The first input test pads 510 and the second input test pads 520 may be located or disposed to be adjacent to the first output test pads 410 and the second test output pads 420. The first input test pads 510 and the second input test pads 520 may be located or disposed at an edge of or periphery of the display panel 100. A cutting line CL may be located or disposed between the first output test pads 410 and the first input test pads 510. Similarly, a cutting line CL may be located or disposed between the second output test pads 420 and the second input test pads 520. Thus, the first input test pads 510 and the second input test pads 520 may be removed by a cutting or separation or removal process. In case of the first input extending wires 710 that are respectively extended to the first input test pads 510 and the first input pads 310, portions of the first input extending wires 710 may be located or disposed in the driver IC pad area ICP, portions may be located or disposed in the flexible printed circuit pad area FCP, and the remainder may be located or disposed in the test pad area TP. Similarly, the second input extending wires 720 that are respectively extended to the second input test pads 520 and the second input pads 320, portions of the second input extending wires 720 may be located or disposed in the driver IC pad area ICP, other portions may be located or disposed in the flexible printed circuit pad area FCP, and the remainder may be located or disposed in the test pad area TP. Thus, a portion of the first input extending wires 710 located or disposed in the test pad area TP and a portion of the second input extending wires 720 located or disposed in the test pad area TP may be removed by a cutting process or other separation or removal process.

Portions of the first input extending wires 710 may be located or disposed between the first output test pads 410.

Portions of the second input extending wires 720 may be located or disposed between the second output test pads 420.

As shown in FIG. 3 to FIG. 5, the first input pads 310, the second input pads 320, the first output pads 210, and the second output pads 220 may be located or disposed in the driver IC pad area ICP of the display panel 100. The first input pads 310, the second input pads 320, the first output pads 210, and the second output pads 220 may be respectively formed in the shape of a parallelogram. However, this is merely an example, and the planar shape of the first input pads 310, the second input pads 320, the first output pads 210, and the second output pads 220 may vary. For example, the first input pads 310, the second input pads 320, the first output pads 210, and the second output pads 220 may be formed in a rectangular shape.

The first output test pads 410 and the second output test pads 420 may be located or disposed in the flexible printed circuit pad area FCP of the display panel 100. The first output test pads 410 and the second output test pads 420 may be respectively formed in the shape of a parallelogram. However, this is just one example, and the planar shape of the first output test pads 410 and the second output test pads 420 may be variously changed. For example, the first output test pads 410 and the second output test pads 420 may have a rectangular shape. It is to be understood that the shapes of the various pads are not limited to that which is illustrated and may include any shapes within the spirit and the scope of the disclosure.

The first output pads 210 and the first output test pads 410 may be extended to each other by the first output extending wires 610. Hereinafter, the first output pads 210, the first output test pads 410, and a connection portion of the first output pads 210 and the first output test pads 410 will be described.

A buffer layer 120 may be located or disposed on a buffer substrate 110. The buffer layer 120 may be formed of a single layer of a silicon nitride (SiNx) or a multilayer structure in which a silicon nitride (SiNx) and a silicon oxide (SiOx) may be stacked. The buffer layer 120 may serve to planarize the surface of the substrate 110 while preventing penetration of unnecessary components such as impurities or moisture.

For clarity and ease of description, a single first output pad 210 and a single first output extending wire 610 and other elements in singular form are described with reference to FIG. 4. The first output pad 210 may be located or disposed on the buffer layer 120. The first output extending wire 610 extended from the first output pad 210 may be located or disposed on the buffer layer 120. The first output extending wire 610 may be branched from the first output pad 210 to the flexible printed circuit pad region FCP, while bypassing the first input pad 310 as illustrated in FIG. 3. The first output extending wire 610 may be in the form of a zigzag shape.

An insulation layer 140 may be located or disposed on the buffer layer 120, the first output pad 210, and the first output extending wire 610. The insulating layer 140 may include an inorganic insulating material or an organic insulating material such as a silicon oxide (SiOx), a silicon nitride (SiNx), a silicon oxynitride (SiOxNy), fluorinated silicon oxide (SiOF), an aluminum oxide (AlOx), and the like, and may be formed of a single layer or multiple layers containing at least one of these materials. The insulation layer 140 may include a contact hole 142 that may overlap at least a part of the first output extending wire 610. The first output test pad 410 may be located or disposed on the insulation layer 140. The first output test pad 410 may be connected with the first output extending wire 610 through the contact hole 142.

A passivation layer 160 may be located or disposed on the insulation layer 140 and the first output test pad 410. The passivation layer 160 may include an inorganic insulating material or an organic insulating material, such as a silicon oxide (SiOx), a silicon nitride (SiNx), silicon oxynitride (SiOxNy), silicon fluoride (SiOF), an aluminum oxide (AlOx), and the like, and may be a single layer or multiple layers containing at least one of these materials. The passivation layer 160 may include an opening 162 that overlaps at least a part of the first output pad 210. At least a part of the first output pad 210 may be exposed by the opening 162. The passivation layer 160 may include an opening 164 that overlaps at least a part of the first output test pad 410. At least a part of the first output test pad 410 may be exposed by the opening 164.

The first output pad 210, the first output test pad 410, and the first output extending wire 610 are respectively illustrated as single layers, but the embodiment is not limited thereto. The first output pad 210, the first output test pad 410, and the first output extending wire 610 may be formed of multiple layers.

The second output pad 220 and the second output test pad 420 may be extended by the second output extending wire 620. The second output extending wire 620 may be branched from the second output pad 220 to the flexible printed circuit pad area FCP, while bypassing the second input pad 320 as illustrated in FIG. 3. The second output extending wire 620 may be in the form of a zigzag shape. The second output test pad 420 and the second output extending wire 620 may be located or disposed on different layers, while disposing the insulation layer 140 therebetween, and may be connected with each other through a contact hole 152.

First input test pads 510 and second input test pads 520 may be located or disposed in the test pad area TP of the display panel 100. The first input test pads 510 and the second input test pads 520 may be respectively formed in the shape of a rectangle. However, this is merely an example, and a planar shape of the first input test pads 510 and the second input test pads 520 may be variously changed within the spirt and the scope of the disclosure. For example, the first input test pads 510 and the second input test pads 520 may be formed in the shape of a parallelogram.

The first input pads 310 and the first input test pads 510 may be extended by the first input extending wire 710. The first input extending wire 710 may include a first portion 712, a second portion 714, and a third portion 716. The first portion 712, the second portion 714, and the third portion 716 may be in a zigzag shape.

The second portion 714 of the first input extending wire 710 may be located or disposed on the buffer layer 120. The second portion 714 of the first input extending wire 710 may be located or disposed in the flexible printed circuit pad area FCP. The second portion 714 of the first input extending wire 710 may be located or disposed between the first output test pads 410 in the flexible printed circuit pad area FCP.

The insulation layer 140 may be located or disposed on the buffer layer 120 and the second portion 714 of the first input extending wire 710. The insulation layer 140 may include contact holes 144 and 146 that overlap at least a part of the second portion 714 of the first input extending wire 710. The contact holes 144 and 146 may overlap, by way of example, opposite ends of the second portion 714 of the first input extending wire 710. The first input pad 310 and the first portion 712 of the first input extending wire 710, may extend from the first input pad 310, may be located or disposed on the insulation layer 140. The first portion 712 of the first input extending wire 710 may be located or disposed between the driver IC pad area ICP and the flexible printed circuit pad area FCP. The first input test pad 510 and the third portion 716 of the first input extending wire 710, may extend from the first input test pad 510, may be located or disposed on the insulation layer 140. The third portion 716 of the first input extending wire 710 may be located or disposed between the flexible printed circuit pad area FCP and the test pad area TP. The first portion 712 of the first input extending wire 710 may be connected with the second portion 714 of the first input extending wire 710 through the contact hole 144. The third portion 716 of the first input extending wire 710 may be connected with the second portion 714 of the first input extending wire 710 through the contact hole 146. For example, one end of the second portion 714 of the first input extending wire 710 may be connected with the first portion 712, and the other end thereof may be connected with the third portion 716.

The passivation layer 160 may be located or disposed on the insulation layer 140 and the first input extending wire 710. The passivation layer 160 may include an opening 166 that overlaps at least a part of the first input pad 310. At least a part of the first input pad 310 may be exposed by the opening 166. The passivation layer 160 may include an opening 168 that overlaps at least a part of the first input test pad 510. At least a part of the first input test pad 510 may be exposed by the opening 168.

The first input pad 310, the first input test pad 510, and the first input extending wire 710 are respectively illustrated as single layers, but the embodiment is not limited thereto. The first input pad 310, the first input test pad 510, and the first input extending wire 710 may be formed of multiple layers.

The second input pad 320 and the second input test pad 520 may be extended by the second input extending wire 720. The second input extending wire 720 may include a first portion 722, a second portion 724, and a third portion 726. The first portion 722 of the second input extending wire 720 may be branched from the second input pad 320 and thus may extends towards the flexible printed circuit pad area FCP. The third portion 726 of the second input extending wire 720 may be branched from the second input test pad 520 and thus may extend towards a portion adjacent to the flexible printed circuit pad area FCP. The second portion 724 of the second input extending wire 720 may connect the first portion 722 and the third portion 726. The second portion 724 of the second input extending wire 720 may be located or disposed in a layer that is different from that of the first portion 722 and the third portion 726, while disposing the insulation layer 140 therebetween. The first portion 722 of the second input extending wire 720 and the second portion 724 may be connected with each other through a contact hole 154 of the insulation layer 140. The second portion 724 of the second input extending wire 720 and the third portion 726 may be connected with each other through a contact hole 156 of the insulation layer 140.

Referring to FIG. 6 to FIG. 8, the display device in a state after bonding the driver IC to the display device according to an embodiment will be described.

FIG. 6 is a top plan view of the display device according to an embodiment, FIG. 7 is a block diagram of an area of the display device according to an embodiment, and FIG. 8 is a top plan view of the area shown in FIG. 7.

As shown in FIG. 6 to FIG. 8, a driver IC 900 may be located or disposed on the peripheral area PA of the display panel 100. The driver IC 900 may be located or disposed in the driver IC pad area ICP. The driver IC 900 may include first output bumps 910 and second output bumps 920. The first output bumps 910 of the driver IC 900 may overlap the first output pads 210. The first output bumps 910 and the first output pads 210 may be electrically connected with each other. The second output bumps 920 of the driver IC 900 may overlap the second output pads 220. The second output bumps 920 and the second output pads 220 may be electrically connected with each other. The driver IC 900 may include first input bumps 930 and second input bumps 940. The first input bumps 930 of the driver IC 900 may overlap the first input pads 310. The first input bumps 930 and the first input pads 310 may be electrically connected with each other. The second input bumps 940 of the driver IC 900 may overlap the second input pads 320. The second input bumps 940 and the second input pads 320 may be electrically connected with each other.

The driver IC 900 and the display panel 100 may be electrically connected with the first output bumps 910, the second output bumps 920, the first input bumps 930, and the second input bumps 940 of the driver IC 900 by the first output pads 210, the second output pads 220, the first input pads 310, and the second input pads 320 of the display panel 100. The display panel 100 may receive a predetermined signal from the driver IC 900. When the bonding between the display panel 100 and the driving integrated circuit 900 is not properly performed, the driving of the display panel 100 may be adversely affected. Therefore, testing may take place to determine whether bonding between the display panel 100 and the driving integrated circuit 900 is properly performed by measuring the bonding resistance between the display panel 100 and the driving integrated circuit 900.

For example, the bonding resistance between the first output pads 210 and the first output bumps 910 may be measured by applying a predetermined signal to the first output test pads 410 connected with the first output pads 210. Bonding resistance between the second output pads 220 and the second output bumps 920 may be measured by applying a predetermined signal to the second output test pads 420 connected with the second output pads 220. Bonding resistance between the first input pads 310 and the first input bumps 930 may be measured by applying a predetermined signal to the first input test pads 510 connected with the first input pads 310. Bonding resistance between the second input pads 320 and the second input bumps 940 may be measured by applying a predetermined signal to the second input test pads 520 connected with the second input pads 320.

The disclosure is not limited to only pads for testing bonding resistance. Other pads that may be suitable for various other tests may be provided on the test pad area TP within the spirit and the scope of the disclosure. After a test is finished, a cutting process or other separation or removal process for removing the test pad area TP may be carried out. Hereinafter, the display device in a state after the cutting process according to an embodiment will be described with reference to FIG. 9 to FIG. 11.

FIG. 9 is a top plan view of the display device according to an embodiment, FIG. 10 is a block diagram of an area of the display device according to an embodiment, and FIG. 11 is a top plan view of the area shown in FIG. 10.

As shown in FIG. 9 to FIG. 11, portions located or disposed in a lower portion of the display panel 100 with reference to the cutting line CL may be removed, and portions disposed on an upper portion of the display panel 100 may remain. Since the test pad area TP is removed, the first input test pad 510 and the second input test pad 520 located or disposed in the test pad area TP may be removed.

A part of the first input extending wires 710 may be removed, and a part may remain. The remaining portions of the first input extending wires 710 may be located or disposed between the first output test pads 410. Similarly, a part of the second input extending wires 720 may be removed, and a part may remain. The remaining portions of the second input extending wires 720 may be located or disposed between the second output test pads 420.

In an embodiment, components that may be necessary for the bonding resistance test of the driver IC 900 may be located or disposed in the test pad area TP, thereby increasing the utilization of the space of the peripheral area PA of the display panel 100. When the first output test pad 410, the second output test pad 420, the first input test pad 510, and the second input test pad 520, which are components that may be required for the bonding resistance test of the driver IC 900, are all located in the flexible printed circuit pad area FCP, the density of the flexible printed circuit pad area FCP may be increased, and there may be a limit in reducing the width of the peripheral area PA. In an embodiment, the first input test pad 510 and the second input test pad 520 may be located or disposed in the test pad area TP, and after the bonding resistance test is finished, the test pad area TP may be removed by performing a cutting, separation, or removal process so that the density of the flexible printed circuit pad area FCP may be lowered and the width of the peripheral area PA may be further reduced.

The first input test pad 510, which may be an element required for the bonding resistance test, may be placed in the test pad area TP instead of the flexible printed circuit pad area FCP, and thus the first input extending wires 710 connected with the first input test pad 510 may pass between first output test pads 410. As the second input test pad 520, which may be an element required for the bonding resistance test, may be placed in the test pad area TP instead of the flexible printed circuit pad area FCP, the second input extending wires 720 connected with the second input test pad 520 may pass between the second output test pads 420.

The display device in a state after bonding the flexible printed circuit thereto according to an embodiment will be described with reference to FIG. 12 to FIG. 15.

Figure 12:
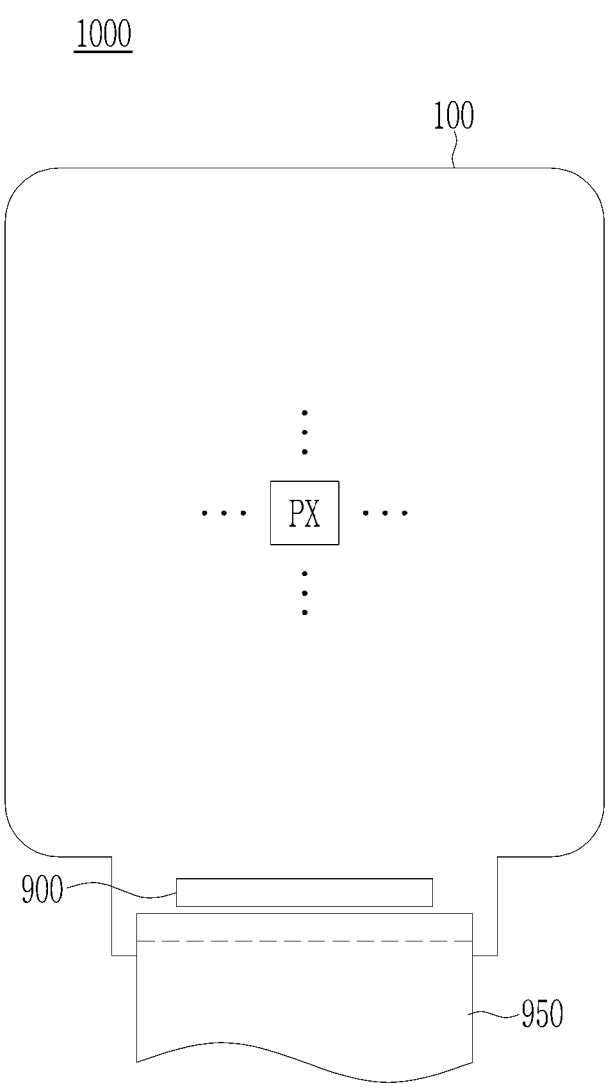
FIG. 12 is a top plan view of the display device according to an embodiment.
Figure 13:
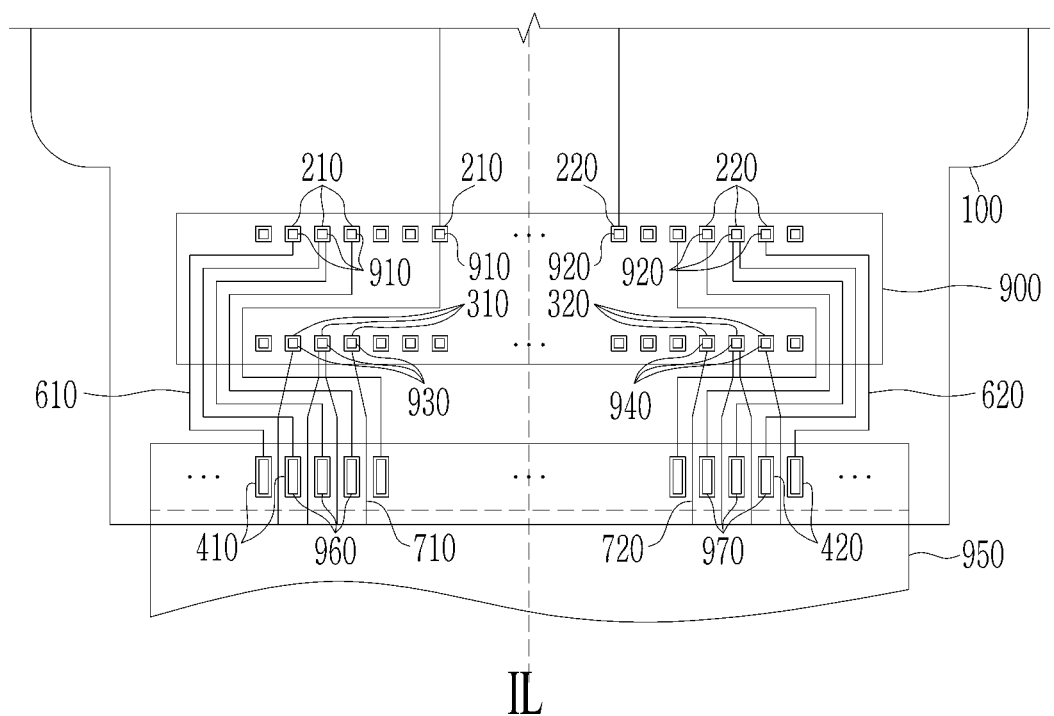
FIG. 13 is a block diagram of an area of the display device according to an embodiment.
Figure 14:
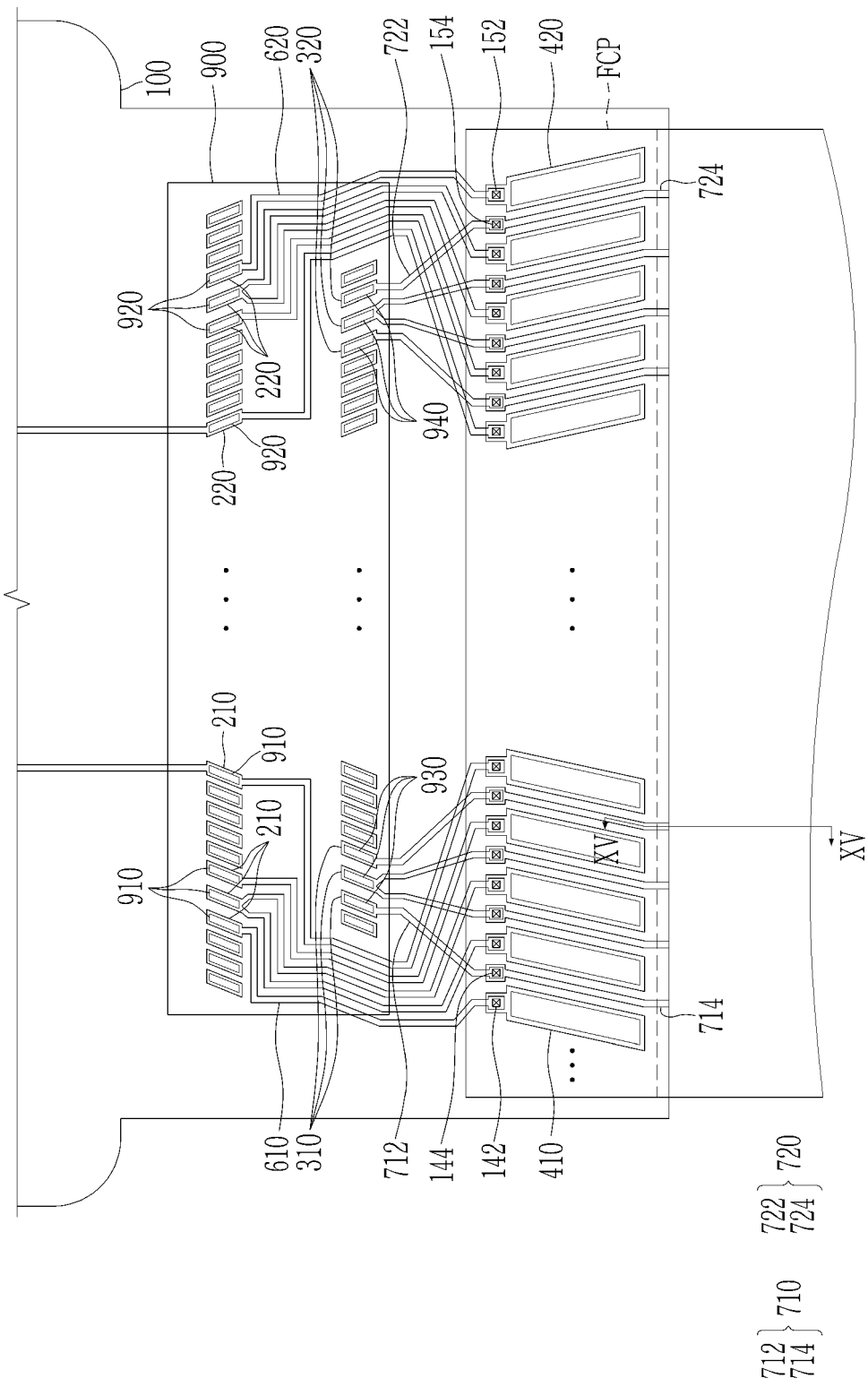
FIG. 14 is a top plan view of the area shown in FIG. 13.
Figure 15:
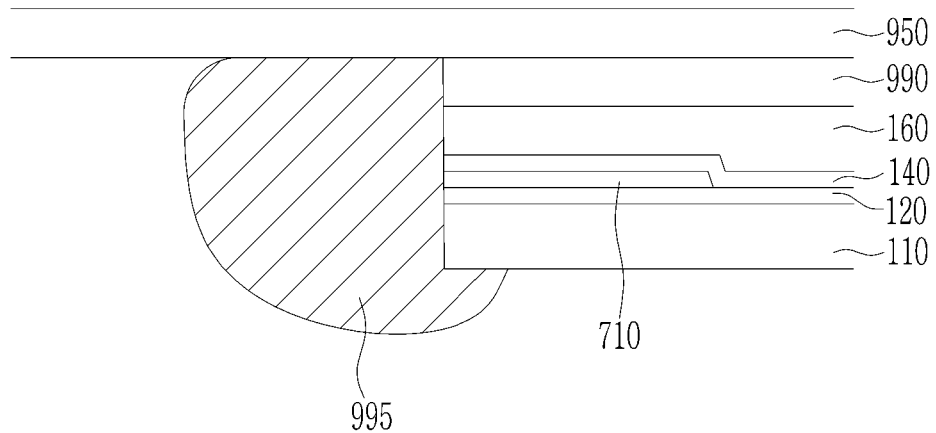
FIG. 15 is a schematic cross-sectional view of FIG. 14, taken along the line XV-XV.

FIG. 12 is a top plan view of the display device according to an embodiment, FIG. 13 is a block diagram of an area of the display device according to an embodiment, and FIG. 14 is a top plan view of the area shown in FIG. 13. FIG. 15 is a schematic cross-sectional view of FIG. 14, taken along the line XV-XV.

As shown in FIG. 12 to FIG. 15, a flexible printed circuit 950 may be located or disposed on the peripheral area PA of the display panel 100. The flexible printed circuit 950 may be located or disposed in the flexible printed circuit pad area FCP. An anisotropic conductive film (ACF) 990, which may have conductivity only in a thickness direction, may be located or disposed between the substrate 110 of the display panel 100 and the flexible printed circuit 950. The flexible printed circuit 950 may include first test bumps 960 and second test bumps 970. The first test bumps 960 of the flexible printed circuit 950 may overlap the first output test pads 410. The first test bumps 960 and the first output test pads 410 may be electrically connected with each other. The second test bumps 970 of the flexible printed circuit 950 may overlap the second output test pads 420. The second test bumps 970 and the second output test pads 420 may be electrically connected with each other.

The flexible printed circuit 950 and the display panel 100 may be electrically connected with each other by the first test bumps 960 and the second test bumps 970 of the flexible printed circuit 950 and the first output test pads 410 and the second output test pads 420 of the display panel 100. The display panel 100 may receive a predetermined signal from the flexible printed circuit 950. The first output test pads 410 and the second output test pads 420 may be applied with a constant voltage.

The first input extending wires 710 may have already been partially removed by the cutting, separation, or removal process. For example, cut, or separated, or removed portions of the first input extending wires 710 may be exposed, thereby electrically affecting the display panel 100. In an embodiment, a finish member 995 may be located or disposed to cover a bottom or lower surface and a side surface of an edge of the display panel 100 and a bottom or lower surface of the flexible printed circuit 950. The finish member 995 may be formed of a material such as a resin and the like. Since the finish member 995 may be located or disposed to cover the first input extending wires 710, occurrence of electrical influence due to the exposure of the first input extending wires 710 may be prevented.

A display device according to an embodiment will be described with reference to FIG. 16 and FIG. 17.

Figure 16:
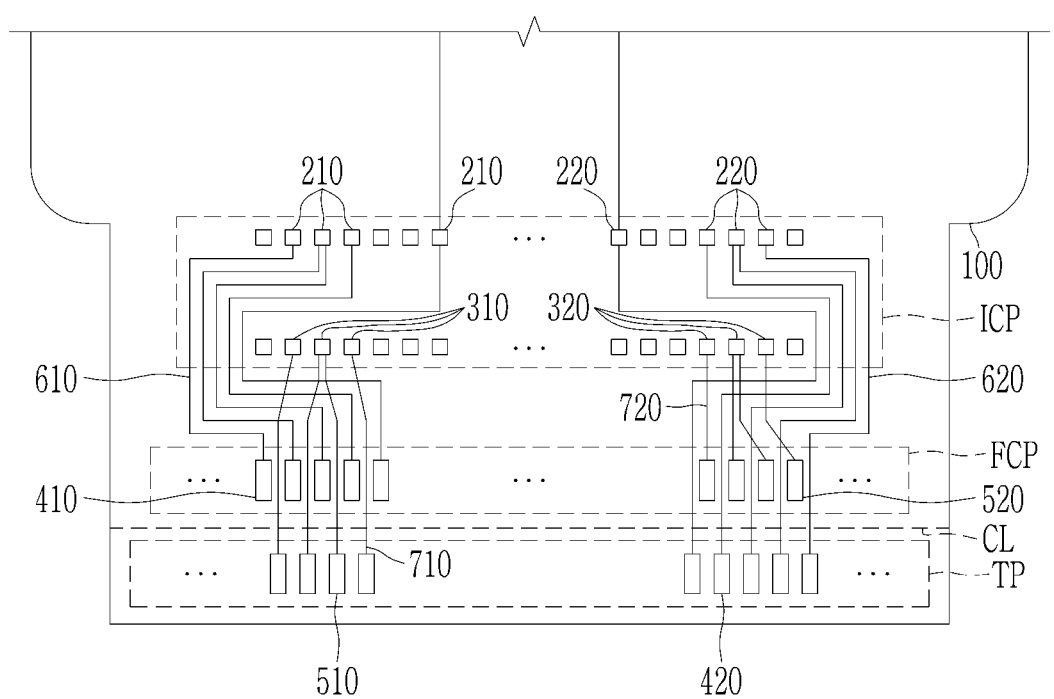
FIG. 16 is a block diagram of an area of a display device according to an embodiment.
Figure 17:
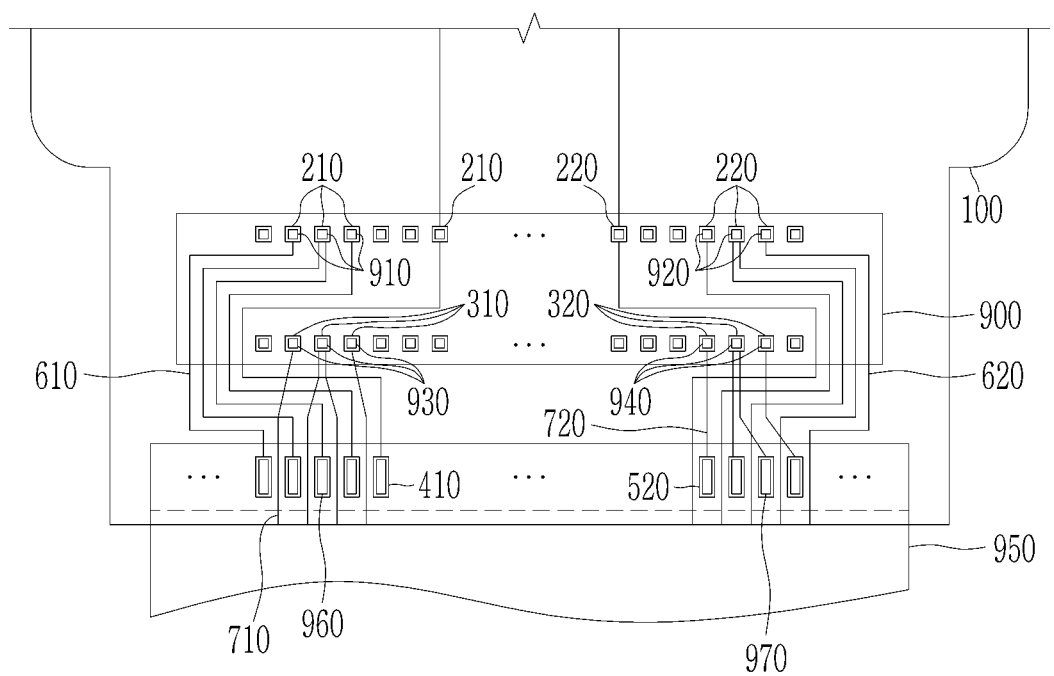
FIG. 17 is a block diagram of an area of a display device according to an embodiment.

The display device according to an embodiment shown in FIG. 16 and FIG. 17 may be similar to the display device according to an embodiment shown in FIG. 1 to FIG. 15, and therefore a description of the same parts will be omitted. In an embodiment, positions of the second output test pad 420 and the second input test pad 520 may be different from those of an embodiment, which will be further described below.

FIG. 16 is a block diagram of an area of a display device according to an embodiment. FIG. 16 shows the display device in a state before bonding a driver IC to the display device according to an embodiment. FIG. 17 is a block diagram of an area of a display device according to an embodiment. FIG. 17 shows a state in which a cutting, separation, or removal process of the display device according to an embodiment may be performed and then a flexible printed circuit may be bonded to the display device. FIG. 16 and FIG. 17 show peripheral areas of the display panels.

As shown in FIG. 16, a display panel 100 may include a driver IC pad area ICP, a flexible printed circuit pad area FCP, and a test pad area TP. A cutting line CL may be located or disposed between the flexible printed circuit pad area FCP and the test pad area TP.

First input pads 310 and first output pads 210 may be located or disposed in the driver IC pad area ICP of the display panel 100. Second input pads 320 and second output pads 220 may be provided in the driver IC pad area ICP of the display panel 100.

First output test pads 410 may be located or disposed in the flexible printed circuit pad area FCP of the display panel 100. The first output pads 210 and the first output test pads 410 may be extended by first output extending wires 610. Second input test pads 520 may be located or disposed in the flexible printed circuit pad area FCP of the display panel 100. The second input pads 320 and the second input test pads 520 may be respectively extended by second input extending wires 720. The first output test pads 410 and the second input test pads 520 may be linearly (or substantially linearly) arranged. However, the disclosure is not limited thereto.

First input test pads 510 may be located or disposed in the test pad area TP of the display panel 100. The first input pads 310 and the first input test pads 510 may be respectively extended by the first input extending wires 710. Second output test pads 420 may be located or disposed in the test pad area TP of the display panel 100. The second output pads 220 and the second output test pads 420 may be respectively extended by second output extending wires 620. The first input test pads 510 and the second output test pads 420 may be linearly (or substantially linearly) arranged. However, the disclosure is not limited thereto.

In an embodiment, the first input test pad 510 and the second input test pad 520, which may be components that may be necessary for a bonding resistance test, may be positioned in the test pad area TP so that the density of the flexible printed circuit pad area FCP may be lowered and the width of the peripheral area may be further reduced.

As described, the first input test pad 510 may be placed in the test pad area TP instead of the flexible printed circuit pad area FCP, and thus the first input extending wires 710 connected with the first input test pad 510 may pass between output test pads 410. For example, the first input extending wires s 710 may be located or disposed between the first output test pads 410. As the second output test pad 420, which may be an element that may be required for the bonding resistance test, may be placed in the test pad area TP instead of the flexible printed circuit pad area FCP, the second output extending wires 620 connected with the second output test pad 420 may pass between the second input test pads 520. For example, the second output extending wires 620 may be located or disposed between the second input test pads 520.

As shown in FIG. 17, after the cutting or separation or removal process, the test pad area TP of the display panel 100 may be removed. Accordingly, the first input test pads 510 and the second output test pads 420 located or disposed in the test pad area TP may be removed.

A driver IC 900 may be located or disposed in the driver IC pad area ICP of the display panel 100. First output bumps 910 of the driver IC 900 may be electrically connected with the first output pads 210. Second output bumps 920 of the driver IC 900 may be electrically connected with the second output pads 220. A first input bump 930 of the driver IC 900, for example, may be electrically connected with the first input pad 310. A second input bump 940 of the driver IC 900, for example, may be electrically connected with the second input pad 320.

A flexible printed circuit 950 may be located or disposed in the flexible printed circuit pad area FCP of the display panel 100. The first test bumps 960 of the flexible printed circuit 950 may overlap the first output test pads 410. The first test bumps 960 and the first output test pads 410 may be electrically connected with each other. The second test bumps 970 of the flexible printed circuit 950 may overlap the second input test pads 520. The second test bumps 970 and the second input test pads 520 may be electrically connected with each other. The first output test pads 410 and the second input test pads 520 may be applied with a constant voltage.

A display device according to an embodiment will be described with reference to FIG. 18 and FIG. 19.

Figure 18:
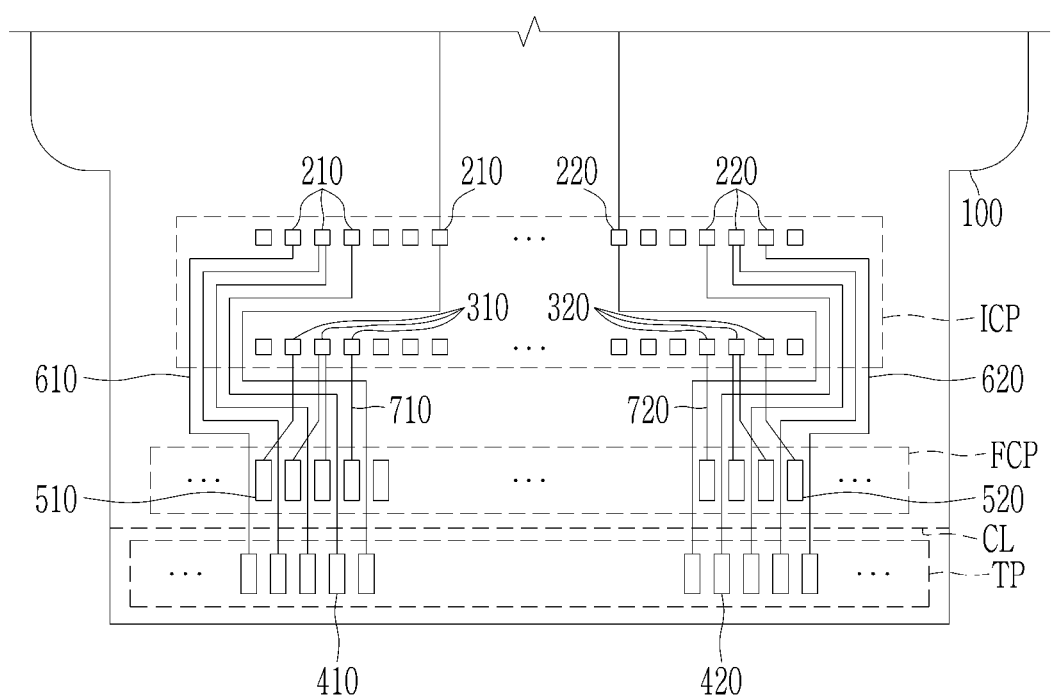
FIG. 18 is a block diagram of an area of a display device according to an embodiment.
Figure 19:
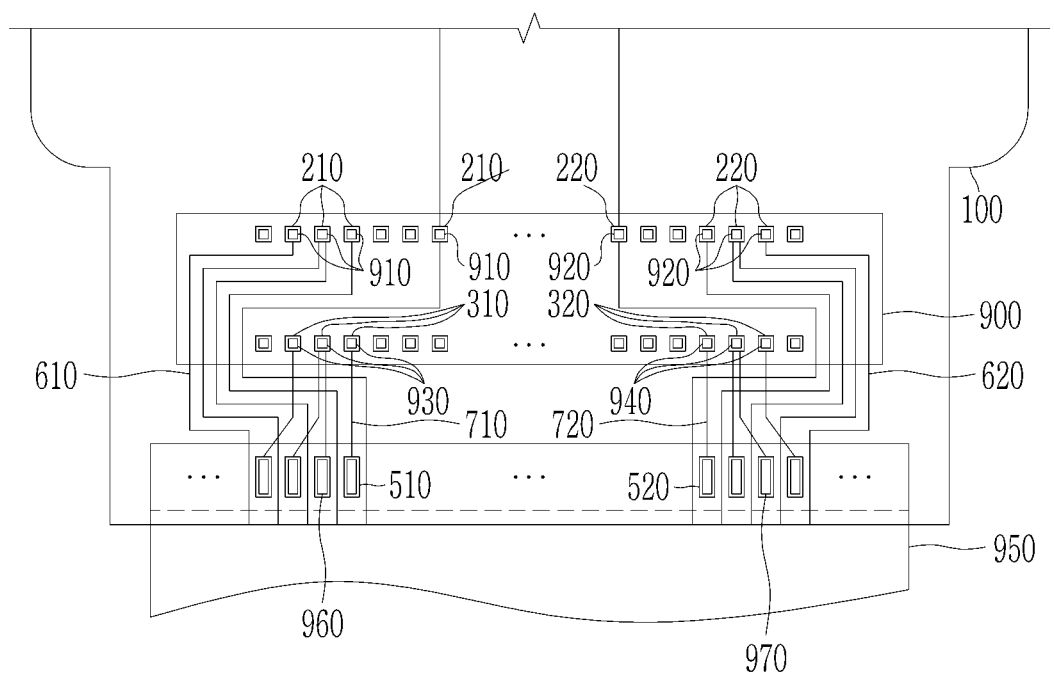
FIG. 19 is a block diagram of an area of a display device according to an embodiment.

The display device according to an embodiment shown in FIG. 18 and FIG. 19 may be similar to the display device according to an embodiment shown in FIG. 1 to FIG. 15, and therefore a description of the same parts will be omitted. In an embodiment, positions of the first output test pad 410, the second output test pad 420, the first input test pad 510, and the second input test pad 520 may be different from those of the previous embodiment, and will be further described below.

FIG. 18 is a block diagram of an area of a display device according to an embodiment. FIG. 18 shows the display device in a state before bonding a driver IC to the display device according to an embodiment. FIG. 19 is a block diagram of an area of a display device according to an embodiment. FIG. 19 shows a state in which a cutting or separation or removal process of the display device according to an embodiment is performed and then a flexible printed circuit is bonded to the display device. FIG. 18 and FIG. 19 show peripheral areas of the display panels.

As shown in FIG. 18, a display panel 100 may include a driver IC pad area ICP, a flexible printed circuit pad area FCP, and a test pad area TP. A cutting line CL may be located or disposed between the flexible printed circuit pad area FCP and the test pad area TP.

First input pads 310 and first output pads 210 may be located or disposed in the driver IC pad area ICP of the display panel 100. Second input pads 320 and second output pads 220 may be located or disposed in the driver IC pad area ICP of the display panel 100. First input test pads 510 may be located or disposed in the flexible printed circuit pad area FCP of the display panel 100. The first input pads 310 and the first input test pads 510 may be extended by first input extending wires 710. Second input test pads 520 may be located or disposed in the flexible printed circuit pad area FCP of the display panel 100. The second input pads 320 and the second input test pads 520 may be respectively extended by second input extending wires 720. First input test pads 510 and second input test pads 520 may be linearly (or substantially linearly) located or disposed.

First output test pads 410 may be located or disposed in the test pad area TP of the display panel 100. The first output pads 210 and the first output test pads 410 may be extended by the first output extending wires 610. Second output test pads 420 may be located or disposed in the test pad area TP of the display panel 100. The second output pads 220 and the second output test pads 420 may be respectively extended by second output extending wires 620. The first output test pads 410 and the second output test pads 420 may be linearly (or substantially linearly) located or disposed.

In an embodiment, the first output test pads 410 and the second output test pads 420, which may be elements necessary for a bonding resistance test, may be positioned or located or disposed in the test pad area TP so that the density of the flexible printed circuit pad area FCP may be lowered and the width of the peripheral area may be further reduced.

As described, the first output test pads 410 may be placed in the test pad area TP instead of the flexible printed circuit pad area FCP, and thus the first output extending wires 610 connected with the first output test pads 410 may pass between the first input test pads 510. For example, the first output extending wires 610 may be located or disposed between the first input test pads 510. For example, as the second output test pads 420, which may be an element required for the bonding resistance test, is placed in the test pad area TP instead of the flexible printed circuit pad area FCP, the second output extending wires 620 connected with the second output test pads 420 may pass between the second input test pads 520. For example, the second output extending wires 620 may be located or disposed between the second input test pads 520.

As shown in FIG. 19, after a cutting or separation or removal process, the test pad area TP of the display panel 100 may be removed. Thus, the first output test pads 410 and the second output test pads 420 may be removed in the test pad area TP.

A driver IC 900 may be located or disposed in the driver IC pad area ICP of the display panel 100. First output bumps 910 of the driver IC 900 may be electrically connected with the first output pads 210. Second output bumps 920 of the driver IC 900 may be electrically connected with the second output pads 220. First input bumps 930 of the driver IC 900 may be electrically connected with the first input pads 310. Second input bumps 940 of the driver IC 900 may be electrically connected with the second input pads 320.

A flexible printed circuit 950 may be located or disposed in the flexible printed circuit pad area FCP of the display panel 100. First test bumps 960 of the flexible printed circuit 950 may overlap the first input test pads 510. The first test bumps 960 and the first input test pads 510 may be electrically connected with each other. Second test bumps 970 of the flexible printed circuit 950 may overlap the second input test pads 520. The second test bumps 970 and the second input test pads 520 may be electrically connected with each other. The first input test pads 510 and the second input test pads 520 may be applied with a constant voltage.

A display device according to an embodiment will be described with reference to FIG. 20 and FIG. 21.

Figure 20:
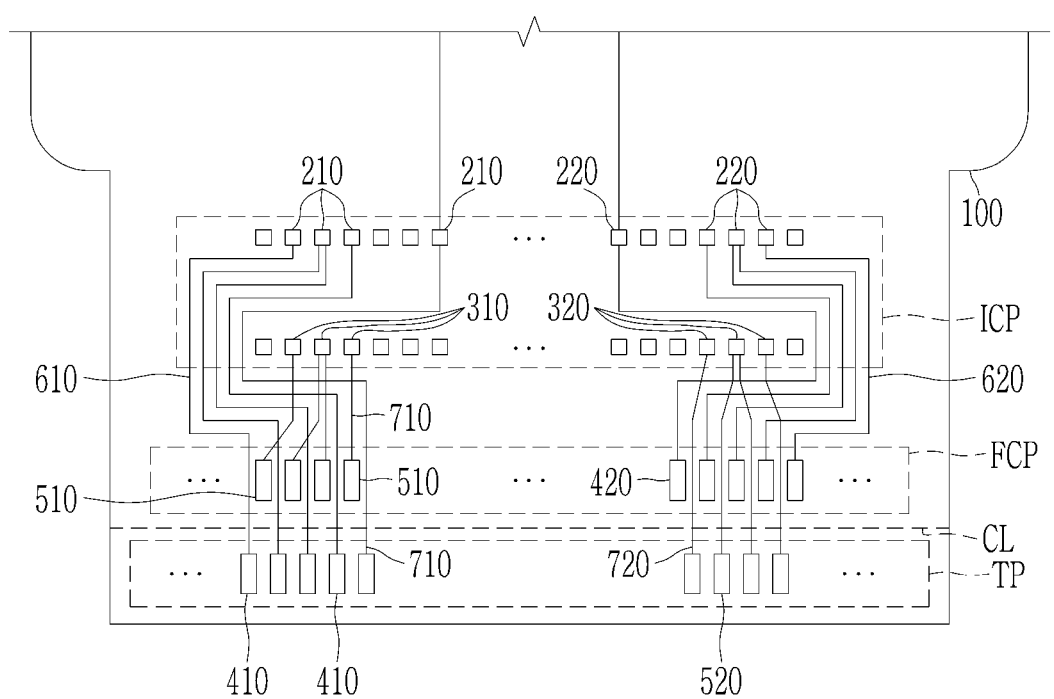
FIG. 20 is a block diagram of an area of a display device according to an embodiment.
Figure 21:
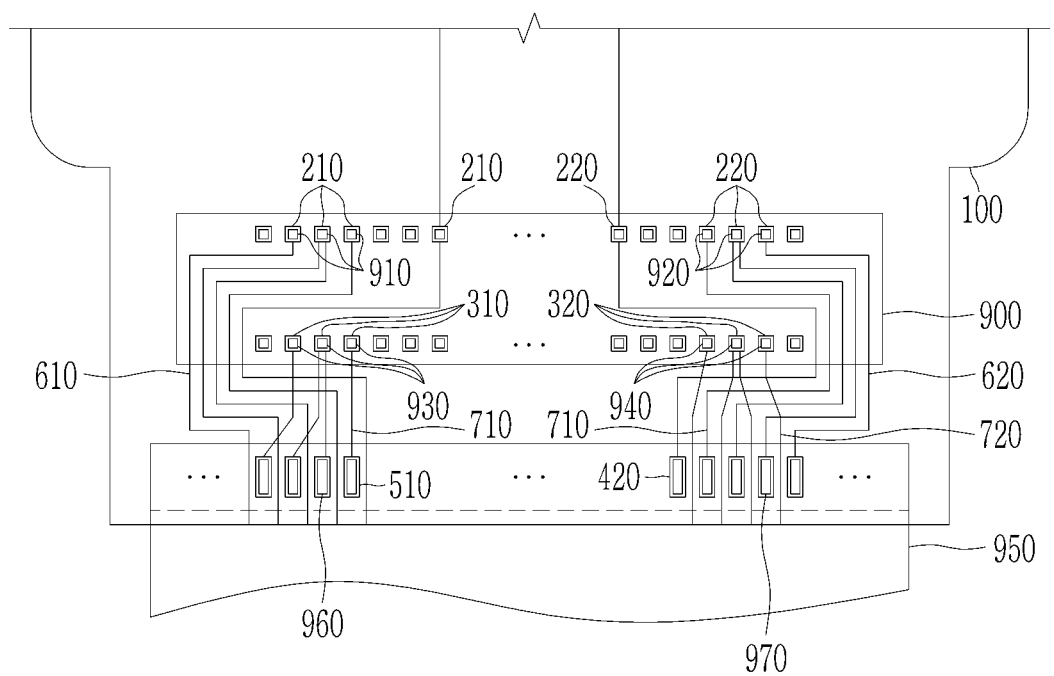
FIG. 21 is a block diagram of an area of a display device according to an embodiment.

The display device according to the embodiment shown in FIG. 20 and FIG. 21 may be similar to the display device according to an embodiment shown in FIG. 1 to FIG. 15, and therefore a description of the same parts will be omitted. In an embodiment, positions of the first output test pads 410 and the first input test pads 510 may be different from those of an embodiment, which will be described below.

FIG. 20 is a block diagram of an area of a display device according to an embodiment. FIG. 20 shows the display device in a state before bonding a driver IC to the display device according to an embodiment. FIG. 21 is a block diagram of an area of a display device according to an embodiment. FIG. 21 shows a state in which a cutting or separation or removal process of the display device according to an embodiment may be performed and then a flexible printed circuit may be bonded to the display device. FIG. 20 and FIG. 21 show peripheral areas of the display panels.

As shown in FIG. 20, a display panel 100 may include a driver IC pad area ICP, a flexible printed circuit pad area FCP, and a test pad area TP. A cutting line CL may be located or disposed between the flexible printed circuit pad area FCP and the test pad area TP.

First input pads 310 and first output pads 210 may be located or disposed in the driver IC pad area ICP of the display panel 100. For example, second input pads 320 and second output pads 220 may be located or disposed in the driver IC pad area ICP of the display panel 100.

First input test pads 510 may be located or disposed in the flexible printed circuit pad area FCP of the display panel 100. The first input pads 310 and the first input test pads 510 may be respectively extended by first input extending wires 710. Second output test pads 420 may be located or disposed in the flexible printed circuit pad area FCP of the display panel 100. The second output pads 220 and the second output test pads 420 may be respectively extended by second output extending wires 620. The first input test pads 510 and the second output test pads 420 may be linearly (or substantially linearly) arranged.

First output test pads 410 may be located or disposed in the test pad area TP of the display panel 100. The first output pads 210 and the first output test pads 410 may be respectively extended by first output extending wires 610. Second input test pads 520 may be located or disposed in the test pad area TP of the display panel 100. The second input pads 320 and the second input test pads 520 may be respectively extended by second input extending wires 720. The first output test pads 410 and the second input test pads 520 may be linearly (or substantially linearly) arranged.

In an embodiment, the first output test pads 410 and the second input test pads 520, which may be elements necessary for a bonding resistance test, may be positioned or located or disposed in the test pad area TP so that the density of the flexible printed circuit pad area FCP may be lowered and the width of the peripheral area may be further reduced.

As described, the first output test pads 410 may be placed in the test pad area TP instead of the flexible printed circuit pad area FCP, and thus the first output extending wires 610 connected with the first output test pads 410 may pass between the first input test pads 510. For example, the first output extending wires 610 may be located or disposed between the first input test pads 510. For example, as the second input test pads 520, which may be elements required for the bonding resistance test, is placed in the test pad area TP instead of the flexible printed circuit pad area FCP, the second input extending wires 720 connected with the second input test pads 520 may pass between the second output test pads 420. For example, the second input extending wires 720 may be located or disposed between the second output test pads 420.

As shown in FIG. 21, after the cutting or separation or removal process, the test pad area PT of the display panel 100 may be removed. Accordingly, the first output test pads 410 and the second input test pads 520 located or disposed in the test pad area TP may be removed.

A driver IC 900 may be located or disposed in the driver IC pad area ICP of the display panel 100. First output bumps 910 of the driver IC 900 may be electrically connected with the first output pads 210. Second output bumps 920 of the driver IC 900 may be electrically connected with the second output pads 220. First input bumps 930 of the driver IC 900 may be electrically connected with the first input pads 310. Second input bumps 940 of the driver IC 900 may be electrically connected with the second input pads 320.

A flexible printed circuit 950 may be located or disposed in the flexible printed circuit pad area FCP of the display panel 100. The first test bumps 960 of the flexible printed circuit 950 may overlap the first input test pads 510. The first test bumps 960 and the first input test pads 510 may be electrically connected with each other. The second test bumps 970 of the flexible printed circuit 950 may overlap the second output test pads 420. The second test bumps 970 and the second output test pads 420 may be electrically connected with each other. The first input test pads 510 and the second output test pads 420 may be applied with a constant voltage.

A display device according to an embodiment will be described with reference to FIG. 22 and FIG. 23.

Figure 22:
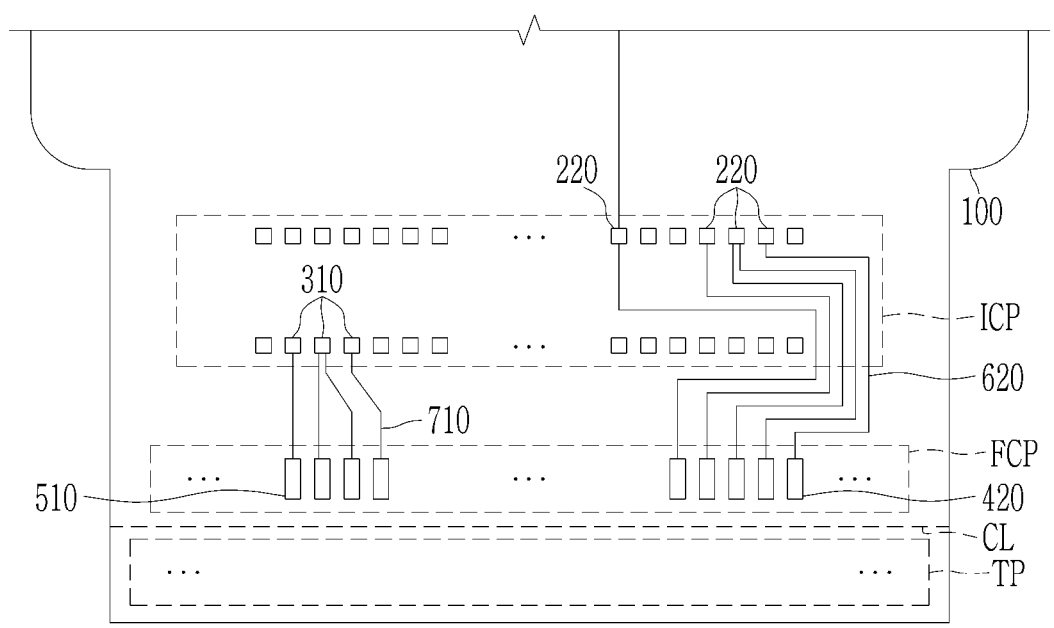
FIG. 22 is a block diagram of an area of a display device according to an embodiment.
Figure 23:
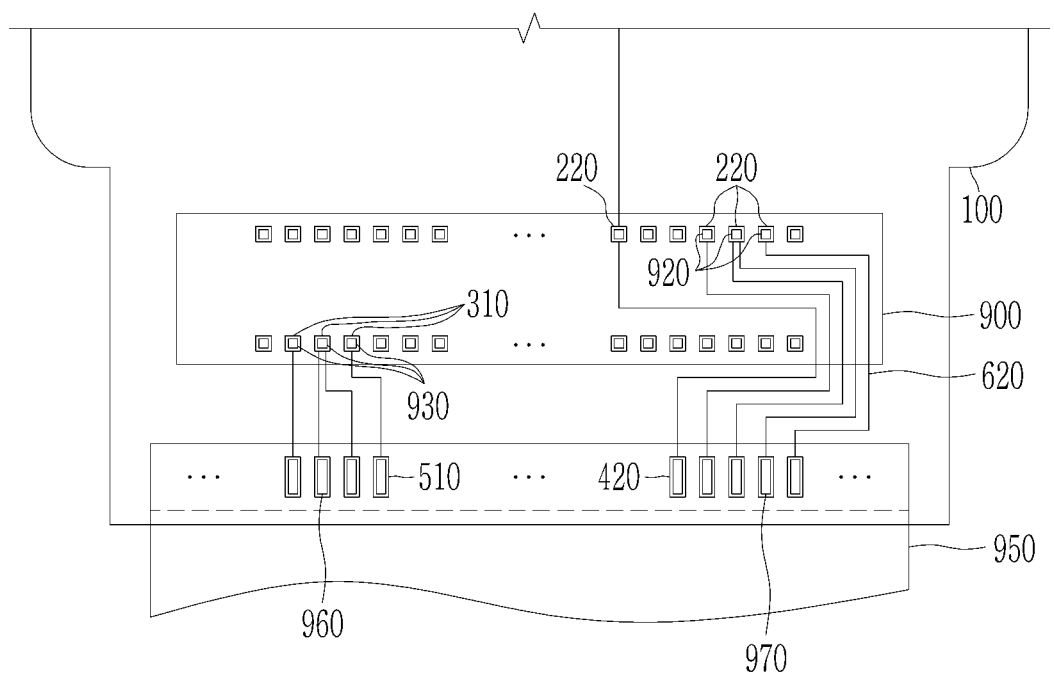
FIG. 23 is a block diagram of an area of a display device according to an embodiment.

The display device according to an embodiment shown in FIG. 22 and FIG. 23 may be similar to the display device according to an embodiment shown in FIG. 20 and FIG. 21, and therefore a description of the same parts will be omitted. An embodiment may be different from the previous embodiment in that the bonding resistance measuring pad may not be located or disposed in the test pad region, which will be described below.

FIG. 22 is a block diagram of an area of a display device according to an embodiment. FIG. 22 shows the display device in a state before bonding a driver IC to the display device according to an embodiment. FIG. 23 is a block diagram of an area of a display device according to an embodiment. FIG. 23 shows a state in which a cutting or separation or removal process of the display device according to an embodiment may be performed and then a flexible printed circuit may be bonded to the display device. FIG. 22 and FIG. 23 show peripheral areas of the display panels.

As shown in FIG. 22, a display panel 100 may include a driver IC pad area ICP, a flexible printed circuit pad area FCP, and a test pad area TP. A cutting line CL may be located or disposed between the flexible printed circuit pad area FCP and the test pad area TP.

First input pads 310 and second output pads 220 may be located or disposed in the driver IC pad area ICP of the display panel 100. In an embodiment, there may be no elements corresponding to the second input pads 320 and the first output pads 210 as in the previous embodiment.

First input test pads 510 may be located or disposed in the flexible printed circuit pad area FCP of the display panel 100. The first input pads 310 and the first input test pads 510 may be respectively extended by first input extending wires 710. Second output test pads 420 may be located or disposed in the flexible printed circuit pad area FCP of the display panel 100. The second output pads 220 and the second output test pads 420 may be respectively extended by second output extending wires 620. The first input test pads 510 and the second output test pads 420 may be linearly (or substantially linearly) arranged.

In an embodiment, a pad for measuring bonding resistance may not be located or disposed in the test pad area TP of the display panel 100. By way of example, in an embodiment, there may be no elements corresponding to the second input extending wires 720 and the first output extending wires 610 as in an embodiment.

In an embodiment, the density of the flexible printed circuit pad area FCP may be reduced, and the width of the peripheral area may be further reduced by omitting elements corresponding to the second input pads 320, the second input extending wires 720, the first output pads 210, and the first output extending wires 610.

As shown in FIG. 23, after the cutting or separation or removal process, the test pad area TP of the display panel 100 may be removed.

A driver IC 900 may be located or disposed in the driver IC pad area ICP of the display panel 100. Second output bumps 920 of the driver IC 900 may be electrically connected with the second output pads 220. First input bumps 930 of the driver IC 900 may be electrically connected with the first input pads 310.

A flexible printed circuit 950 may be located or disposed in the flexible printed circuit pad area FCP of the display panel 100. The first test bumps 960 of the flexible printed circuit 950 may overlap the first input test pads 510. The first test bumps 960 and the first input test pads 510 may be electrically connected with each other. The second test bumps 970 of the flexible printed circuit 950 may overlap the second output test pads 420. The second test bumps 970 and the second output test pads 420 may be electrically connected with each other. The first input test pads 510 and the second output test pads 420 may be applied with a constant voltage.

A display device according to an embodiment will be described with reference to FIG. 24 and FIG. 25.

Figure 24:
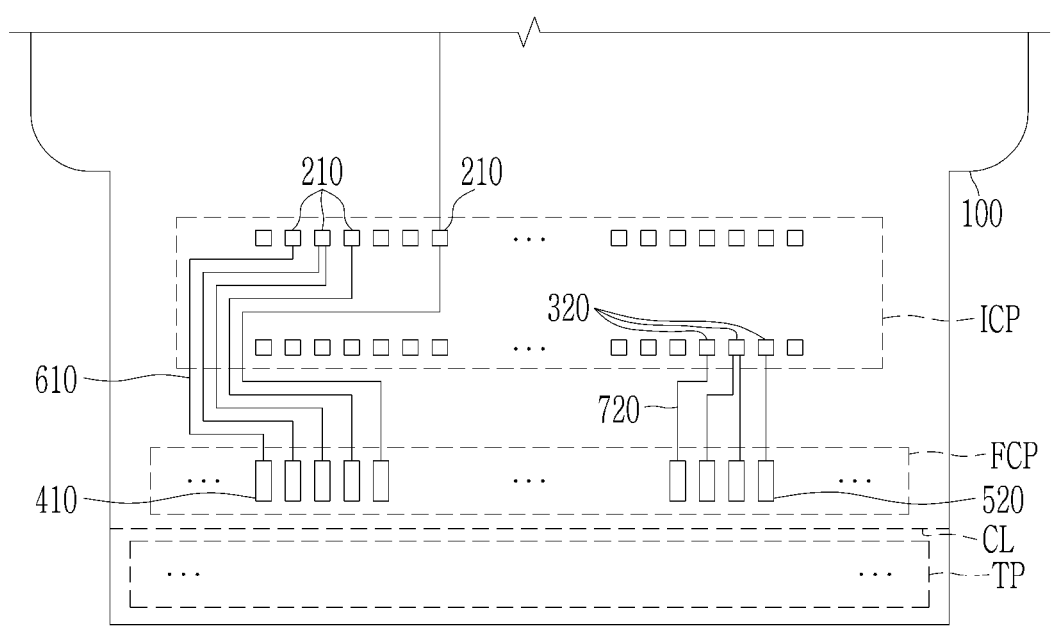
FIG. 24 is a block diagram of an area of a display device according to an embodiment.
Figure 25:
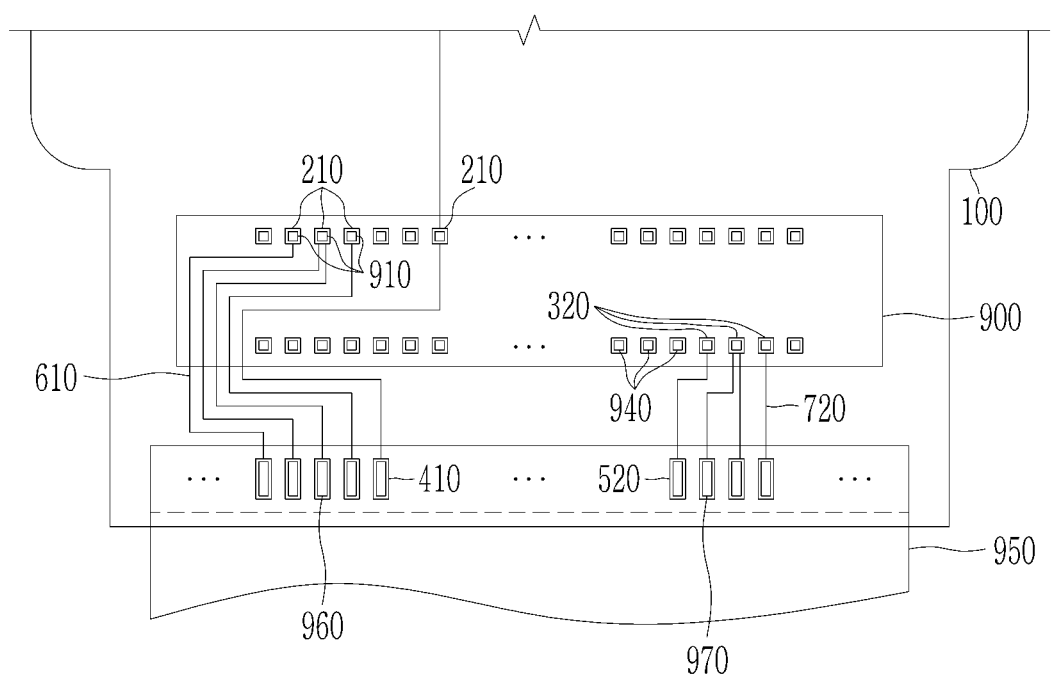
FIG. 25 is a block diagram of an area of a display device according to an embodiment.

The display device according to an embodiment shown in FIG. 24 and FIG. 25 may be similar to the display device according to an embodiment shown in FIG. 16 to FIG. 17, and therefore a description of the same parts will be omitted. The embodiment may be different from the previous embodiment in that the bonding resistance measuring pad may not be located or disposed in the test pad region, which will be described below.

FIG. 24 is a block diagram of an area of a display device according to an embodiment. FIG. 24 shows the display device in a state before bonding a driver IC to the display device according to an embodiment. FIG. 25 is a block diagram of an area of a display device according to an embodiment. FIG. 25 shows a state in which a cutting or separation or removal process of the display device according to an embodiment may be performed and then a flexible printed circuit may be bonded to the display device. FIG. 24 and FIG. 25 show peripheral areas of the display panels.

As shown in FIG. 24, a display panel 100 may include a driver IC pad area ICP, a flexible printed circuit pad area FCP, and a test pad area TP. A cutting line CL may be located or disposed between the flexible printed circuit pad area FCP and the test pad area TP.

First output pads 210 and second input pads 320 may be located or disposed in the driver IC pad area ICP of the display panel 100. In an embodiment, there may be no elements corresponding to the second output pads 220 and the first input pads 310 as in the previous embodiment.

First output test pads 410 may be located or disposed in the flexible printed circuit pad area FCP of the display panel 100. The first output pads 210 and the first output test pads 410 may be respectively extended by first output extending wires 610. Second input test pads 520 may be located or disposed in the flexible printed circuit pad area FCP of the display panel 100. The second input pads 320 and the second input test pads 520 may be respectively extended by second input extending wires 720. First output test pads 410 and second input test pads 520 may be linearly (or substantially linearly) arranged.

In an embodiment, a pad for measuring bonding resistance may not be located or disposed in the test pad area TP of the display panel 100. For example, in an embodiment, there may be no elements corresponding to the second output extending wires 620 and the first input extending wires 710 as in an embodiment.

In an embodiment, the density of the flexible printed circuit pad area FCP may be reduced, and the width of the peripheral area may be further reduced by omitting elements corresponding to the second output pad 220, the first input extending wires 710, the first input pads 310, and the first input extending wires 710.

As shown in FIG. 25, after the cutting or separation or removal process, the test pad area TP of the display panel 100 may be removed.

A driver IC 900 may be located or disposed in the driver IC pad area ICP of the display panel 100. First output bumps 910 of the driver IC 900 may be electrically connected with the first output pads 210. Second input bumps 940 of the driver IC 900 may be electrically connected with the second input pads 320.

A flexible printed circuit 950 may be located or disposed in the flexible printed circuit pad area FCP of the display panel 100. First test bumps 960 of the flexible printed circuit 950 may overlap the first output test pads 410. The first test bumps 960 and the first output test pads 410 may be electrically connected with each other. Second test bumps 970 of the flexible printed circuit 950 may overlap the second input test pads 520. The second test bumps 970 and the second input test pads 520 may be electrically connected with each other. The first output test pads 410 and the second input test pads 520 may be applied with a constant voltage.

While this disclosure has been described in connection with the embodiments, it is to be understood that the disclosure is not limited to the disclosed embodiments. This disclosure is intended to cover various modifications and equivalent arrangements included within the spirit and scope of the disclosure.

What is claimed is:

1. A display device comprising:
    a display panel including pixels and a driver IC pad area;
    a driver IC disposed on the driver IC pad area of the display panel;
    first input pads and first output pads that overlap the driver IC pad area;
    a flexible printed circuit disposed adjacent to the driver IC pad area on the display panel;
    first output test pads that overlap the flexible printed circuit, and are respectively connected to the first output pads; and
    first input extending wires that overlap the flexible printed circuit, are respectively extended to the first input pads, and are disposed between the first output test pads.

2. The display device of claim 1, further comprising second input pads and second output pads that overlap the driver IC pad area, wherein
    the first input pads and the second input pads are symmetric with respect to an imaginary line disposed between the first input pads and the second input pads, and
    the first output pads and the second output pads are symmetric with respect to an imaginary line disposed between the first output pads and the second output pads.

3. The display device of claim 2, wherein
    the first input pads and the second input pads are linearly arranged and adjacent to the flexible printed circuit, and
    the first output pads and the second output pads are linearly arranged at a distance from the first input pads and the second input pads.

4. The display device of claim 2, comprising:
    second output test pads that overlap the flexible printed circuit, and are respectively connected to the second output pads; and
    second input extending wires that overlap the flexible printed circuit, and are extended to the second input pads and disposed between the second output test pads.

5. The display device of claim 4, further comprising:
    first output extending wires that are respectively connected to the first output pads and the first output test pads; and
    second output extending wires that are respectively connected to the second output pads and the second output test pads.

6. The display device of claim 2, comprising:
    second input test pads that overlap the flexible printed circuit, and are respectively connected to the second input pads; and
    second output extending wires that overlap the flexible printed circuit, and are respectively extended to the second output pads and are disposed between the second input test pads.

7. The display device of claim 6, further comprising:
    first output extending wires that are respectively connected to the first output pads and the first output test pads; and
    second input extending wires that are respectively connected to the second input pads and the second input test pads.

8. The display device of claim 1, wherein a constant voltage is applied to the first output test pads.

9. A display device comprising:
    a display panel including pixels;
    a driver IC pad area including a drive IC disposed on the display panel;
    first input pads and first output pads that overlap the driver IC pad area;
    a flexible printed circuit disposed adjacent to the driver IC pad area on the display panel;
    first input test pads that overlap the flexible printed circuit, and are respectively connected to the first input pads; and
    first output extending wires that overlap the flexible printed circuit, and are respectively connected to the first output pads and are disposed between the first input test pads.

10. The display device of claim 9, further comprising second input pads and second output pads that overlap the driver IC pad area, wherein
    the first input pads and the second input pads are symmetric with respect to an imaginary line disposed between the first input pads and the second input pads, and
    the first output pads and the second output pads are symmetric with respect to an imaginary line disposed between the first output pads and the second output pads.

11. The display device of claim 10, wherein
    the first input pads and the second input pads are disposed linearly and adjacent to the flexible printed circuit, and
    the first output pads and the second output pads are linearly arranged at a distance from the first input pads and the second input pads.

12. The display device of claim 10, comprising:
    second input test pads that overlap the flexible printed circuit, and are respectively connected to the second input pads; and
    second output extending wires that overlap the flexible printed circuit, and are respectively extended to the second output pads and disposed between the second input test pads.

13. The display device of claim 12, further comprising:
    first input extending wires that are respectively connected to the first input pads and the first input test pads; and
    second input extending wires that are respectively connected to the second input pads and the second input test pads.

14. The display device of claim 10, comprising:
    second output test pads that overlap the flexible printed circuit, and are respectively connected to the second output pads; and
    second input extending wires that overlap the flexible printed circuit, and are respectively extended to the second input pads and are disposed between the second output test pads.

15. The display device of claim 14, further comprising:
    first input extending wires that are respectively connected to the first input pads and the first input test pads; and
    second output extending wires that are respectively connected to the second output pads and the second output test pads.

16. The display device of claim 9, wherein a constant voltage is applied to the first input test pads.

17. A display device comprising:
    a display panel including pixels;
    first pads disposed on the display panel;
    second pads disposed apart from the first pads on the display panel;
    first test pads respectively connecting to the first pads;
    second test pads respectively connecting to the second pads;

first extending wires connecting to the first pads and the first test pads; and second extending wires connecting to the second pads and the second test pads, wherein the second test pads are disposed at an edge of the display panel, and the second extending wires are disposed between the first test pads.

18. The display device of claim 17, wherein the first test pads are linearly arranged along a first direction, and the second test pads are linearly arranged along the first direction at a distance from the first test pads.

19. The display device of claim 18, wherein the display panel includes a cutting line between the first test pads and the second test pads.

20. The display device of claim 18, wherein the first test pads are symmetric with respect to an imaginary line that extends in a second direction perpendicular to the first direction, and the second test pads are symmetrical with respect to the imaginary line.

21. The display device of claim 18, wherein the first pads are linearly arranged along the first direction, and the second pads are linearly arranged along the first direction at a distance from the first pads.

22. The display device of claim 21, wherein the first pads are symmetric with respect to an imaginary line that extends in a second direction perpendicular to the first direction, and the second pads are symmetric with respect to the imaginary line.

* * * * *